United States Patent
Liaw

(10) Patent No.: US 11,374,088 B2
(45) Date of Patent: Jun. 28, 2022

(54) LEAKAGE REDUCTION IN GATE-ALL-AROUND DEVICES

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 40 days.

(21) Appl. No.: 16/994,274

(22) Filed: Aug. 14, 2020

(65) Prior Publication Data

US 2022/0052155 A1    Feb. 17, 2022

(51) Int. Cl.
  *H01L 29/06* (2006.01)
  *H01L 29/78* (2006.01)
  *H01L 29/417* (2006.01)

(52) U.S. Cl.
  CPC .... *H01L 29/0638* (2013.01); *H01L 29/41791* (2013.01); *H01L 29/785* (2013.01); *H01L 2029/7858* (2013.01)

(58) Field of Classification Search
  CPC .................. H01L 29/0638; H01L 2029/7858
  See application file for complete search history.

(56) References Cited

U.S. PATENT DOCUMENTS

| | | |
|---|---|---|
| 5,143,866 A | 9/1992 | Matsutani |
| 6,768,144 B2 | 7/2004 | Houston et al. |
| 7,026,689 B2 | 3/2006 | Liaw |
| 7,419,898 B2 | 9/2008 | Liaw |
| 7,586,147 B2 | 9/2009 | Liaw |
| 8,310,860 B1 | 11/2012 | Houston |

(Continued)

FOREIGN PATENT DOCUMENTS

EP    0023429    12/1985

OTHER PUBLICATIONS

Yang, Chih-Chuan, et al., "Well Pick-Up Region Design for Improving Memory Macro Performance", U.S. Appl. No. 16/657,421, filed Oct. 18, 2019, 31 pages of specification, 9 pages of drawings.

(Continued)

*Primary Examiner* — Farun Lu
(74) *Attorney, Agent, or Firm* — Haynes and Boone, LLP

(57) ABSTRACT

A semiconductor device includes a substrate; a well of a first conductivity-type and including an anti-punch-through (APT) layer of the first conductivity-type; source and drain features of a second conductivity-type over the APT layer; a strap feature of the first conductivity-type over the well; multiple vertically-stacked channel layers over the APT layer and connecting the source and drain features; a gate wrapping around each channel layer; source and drain contacts electrically coupled to the source and drain features; source and drain vias landed on the source and drain contacts; a strap contact electrically coupled to the strap feature; and a strap via landed on the strap contact. The source via and the strap via are configured to be coupled to different voltages during a non-active mode of the semiconductor device and to be coupled to a substantially same voltage during an active mode of the semiconductor device.

20 Claims, 21 Drawing Sheets

(56) References Cited

U.S. PATENT DOCUMENTS

| | | |
|---|---|---|
| 8,693,235 B2 | 4/2014 | Liaw |
| 8,772,109 B2 | 7/2014 | Colinge |
| 8,785,285 B2 | 7/2014 | Tsai et al. |
| 8,805,985 B2 | 8/2014 | Monjas Llorente et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,980,763 B2 | 3/2015 | Wang et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,607,685 B2 | 3/2017 | Liaw |
| 9,613,953 B2 | 4/2017 | Liaw |
| 9,625,824 B2 | 4/2017 | Lu et al. |
| 9,627,379 B1 | 4/2017 | Chang et al. |
| 9,646,973 B2 | 5/2017 | Liaw |
| 9,691,471 B2 | 6/2017 | Liaw |
| 9,793,273 B2 | 10/2017 | Liaw |
| 10,050,045 B1 | 8/2018 | Hsu et al. |
| 10,314,154 B1 | 6/2019 | Hsu et al. |
| 2008/0116400 A1 | 5/2008 | Schmidt et al. |
| 2013/0063803 A1 | 3/2013 | Delgado et al. |
| 2014/0153321 A1 | 6/2014 | Liaw |
| 2016/0049410 A1 | 2/2016 | Seshadri et al. |
| 2016/0372182 A1 | 12/2016 | Liaw |
| 2017/0110454 A1 | 4/2017 | Chang et al. |
| 2017/0125411 A1 | 5/2017 | Yu et al. |
| 2019/0067277 A1 | 2/2019 | Tsai et al. |
| 2019/0103472 A1 | 4/2019 | Cheng et al. |
| 2020/0052116 A1* | 2/2020 | Kim ............... H01L 21/823807 |
| 2020/0411515 A1* | 12/2020 | Kim .................... H01L 29/7851 |
| 2021/0134784 A1* | 5/2021 | Kim .................. H01L 29/78696 |

OTHER PUBLICATIONS

Su, Hsin-Wen, et al., "Cut Metal Gate in Memory Macro Edge and Middle Strap", U.S. Appl. No. 16/441,217, filed Jun. 14, 2019, 25 pages of specification, 11 pages of drawings.

Liaw, Jhon Jhy et al., "Gate-All-Around Devices with Optimized Gate Spacers and Gate End Dielectric", U.S. Appl. No. 16/899,874, filed Jun. 11, 2020, 36 pages of specification, 33 pages of drawings.

Chiu, Yi-Hsun et al., "Low Resistance Pickup Cells for SRAM", U.S. Appl. No. 16/858,460, filed Apr. 24, 2020, 24 pages of specification, 13 pages of drawings.

* cited by examiner

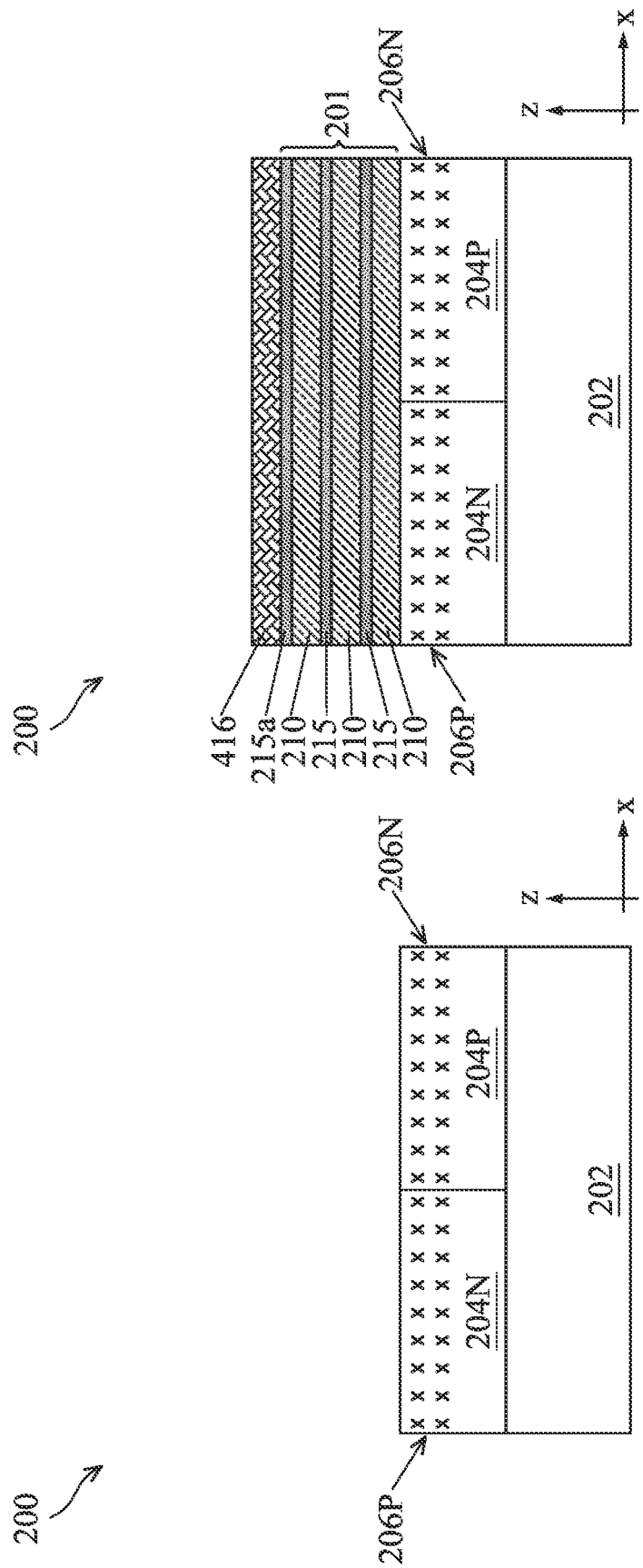

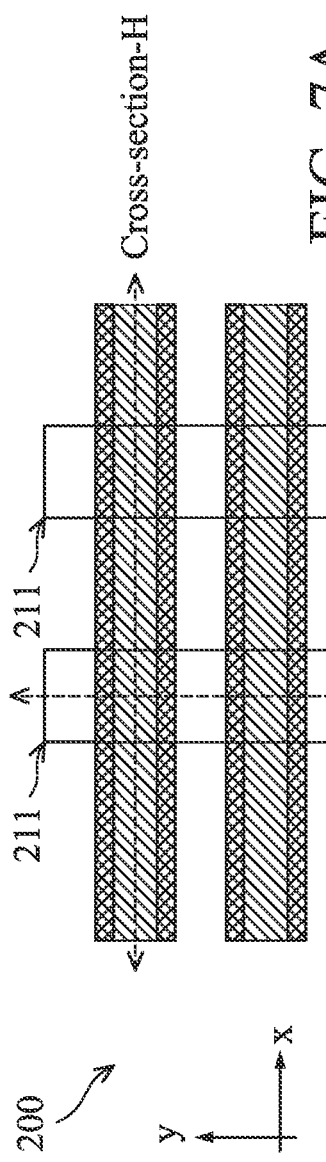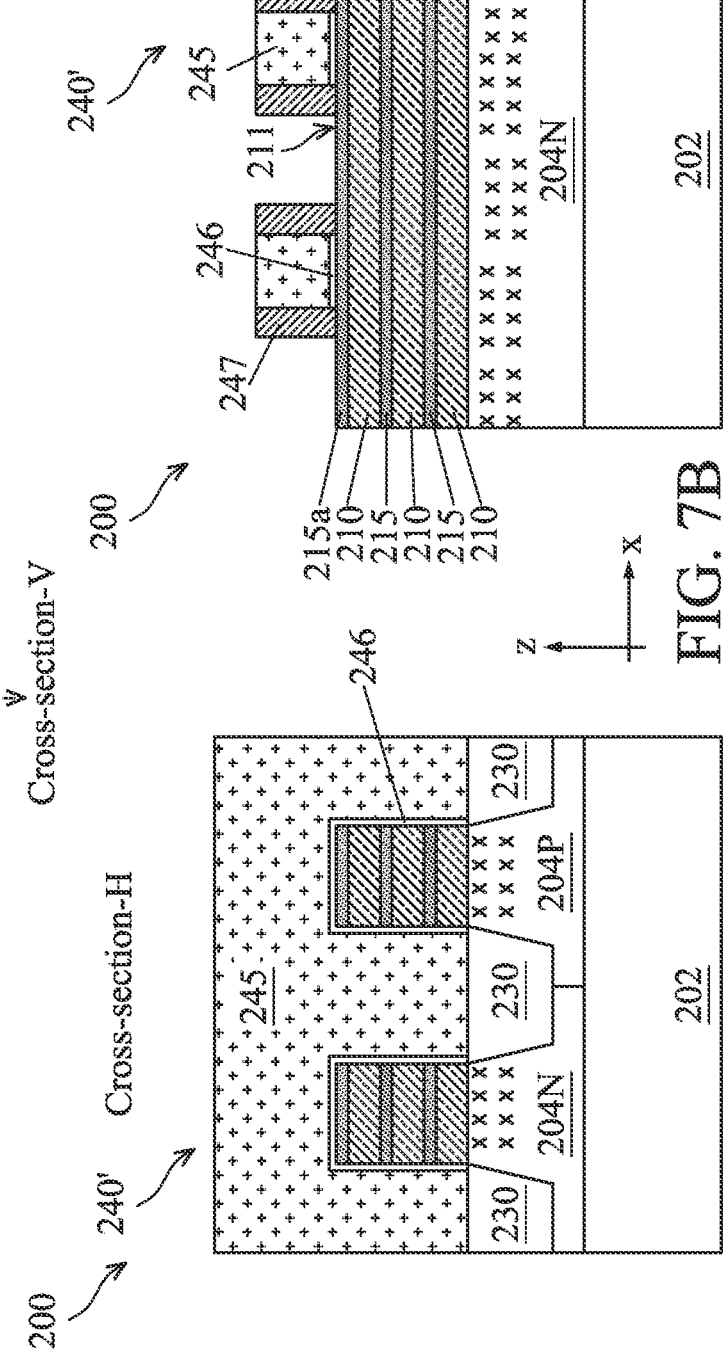

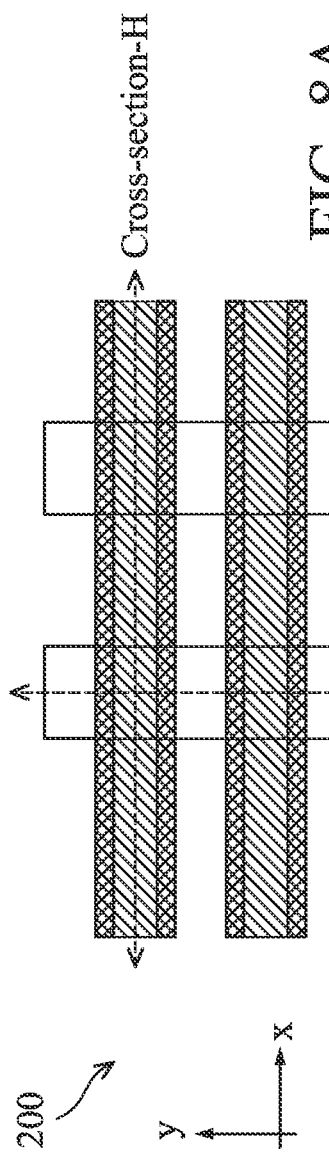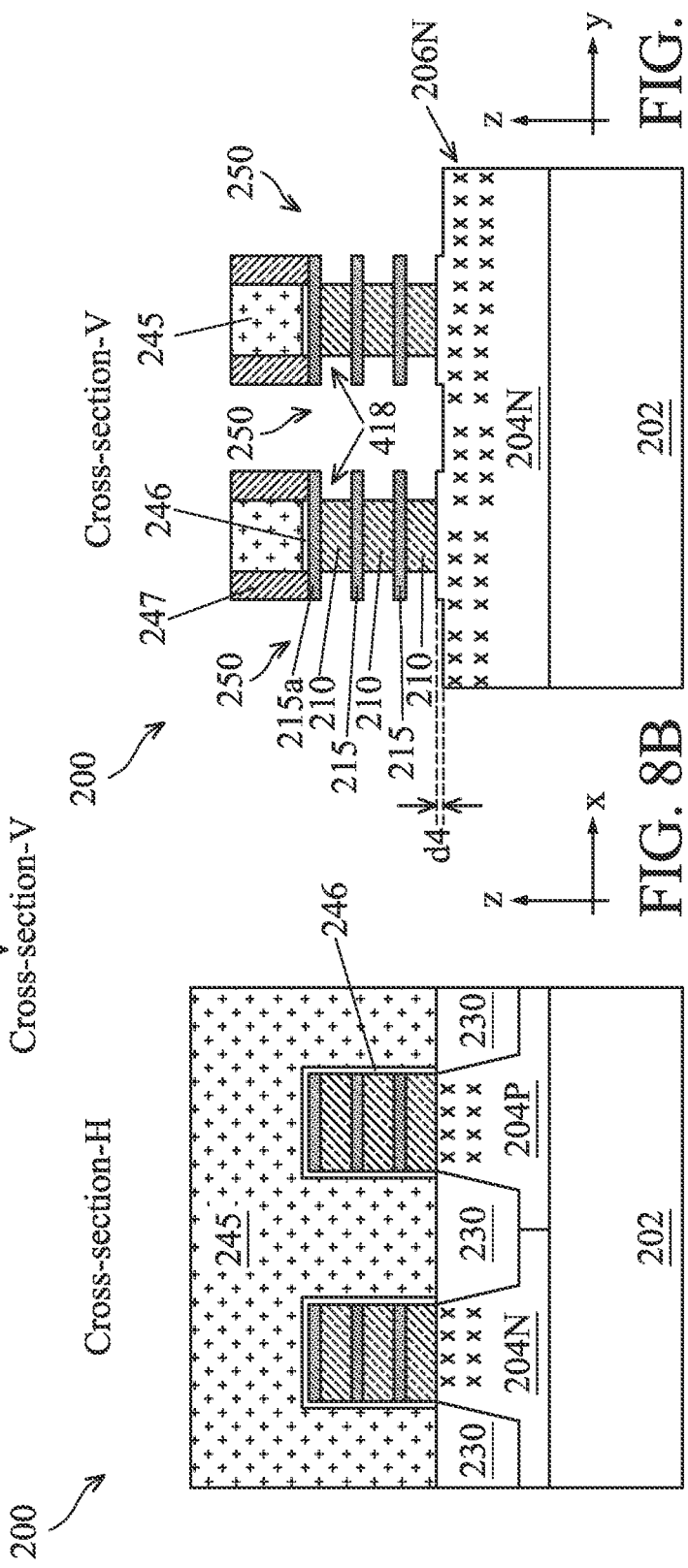

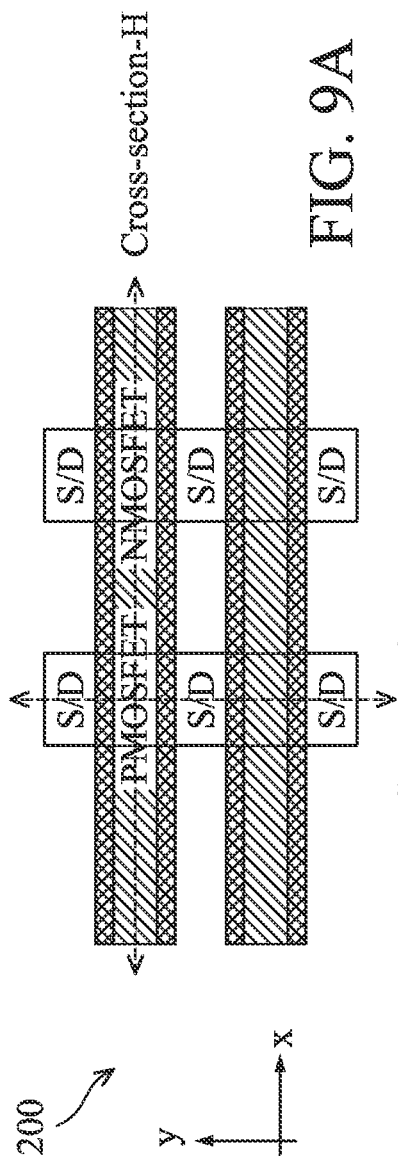
FIG. 9A
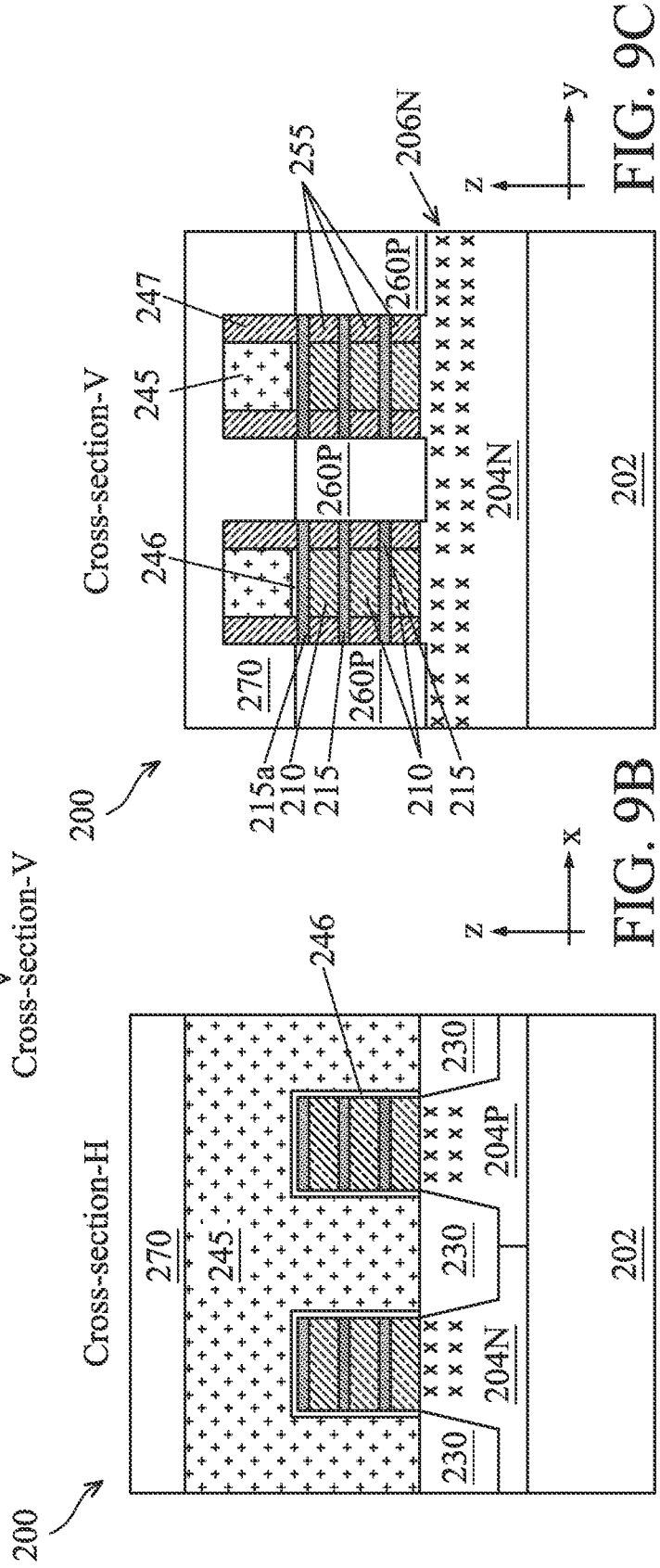
FIG. 9B
FIG. 9C

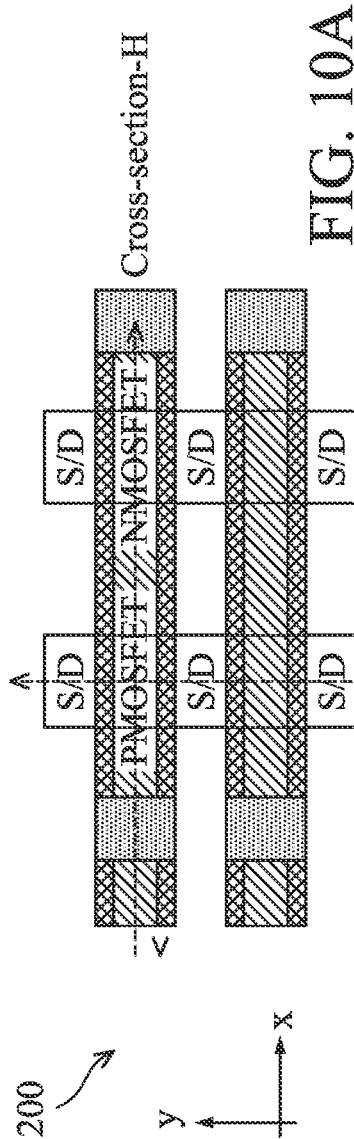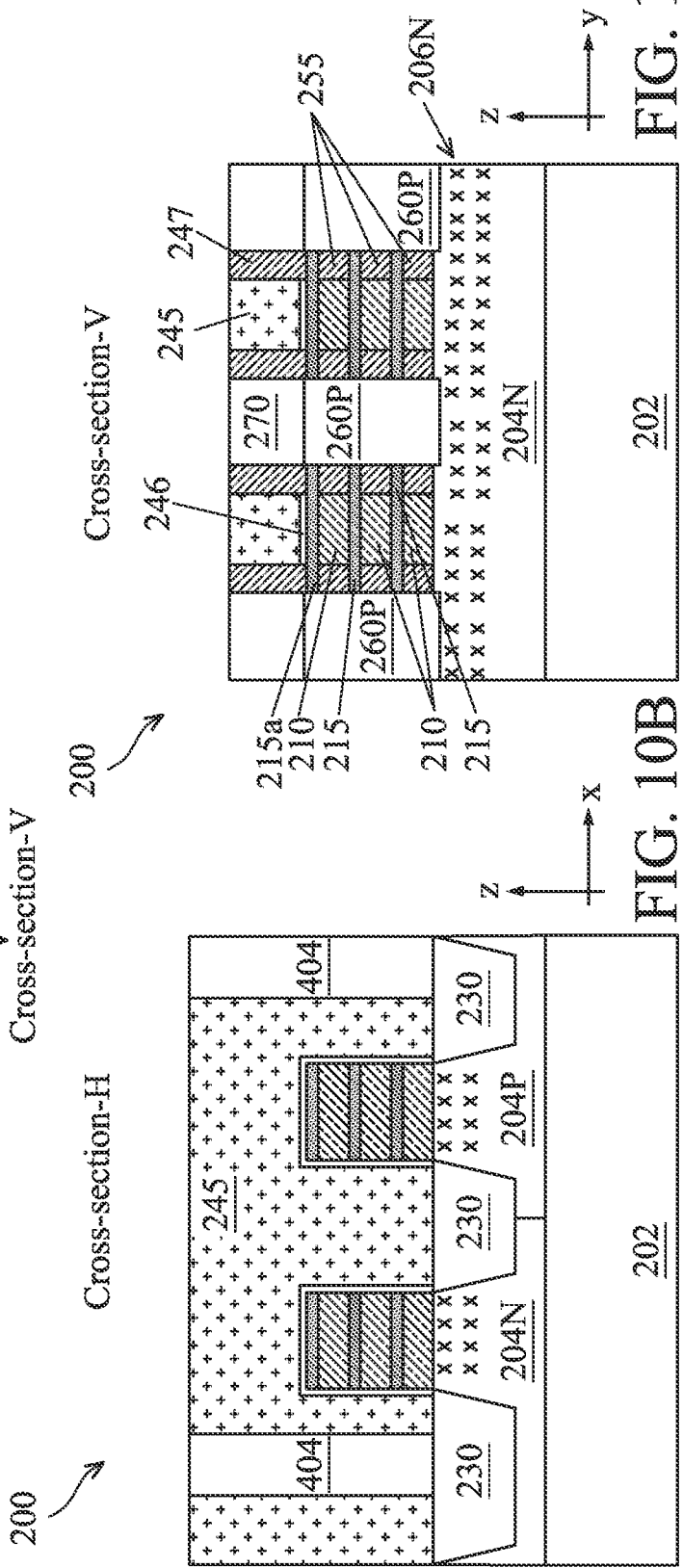

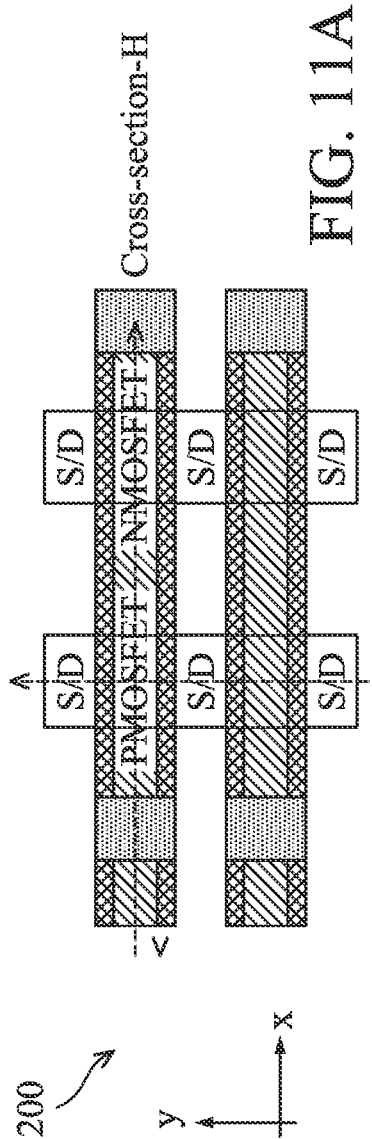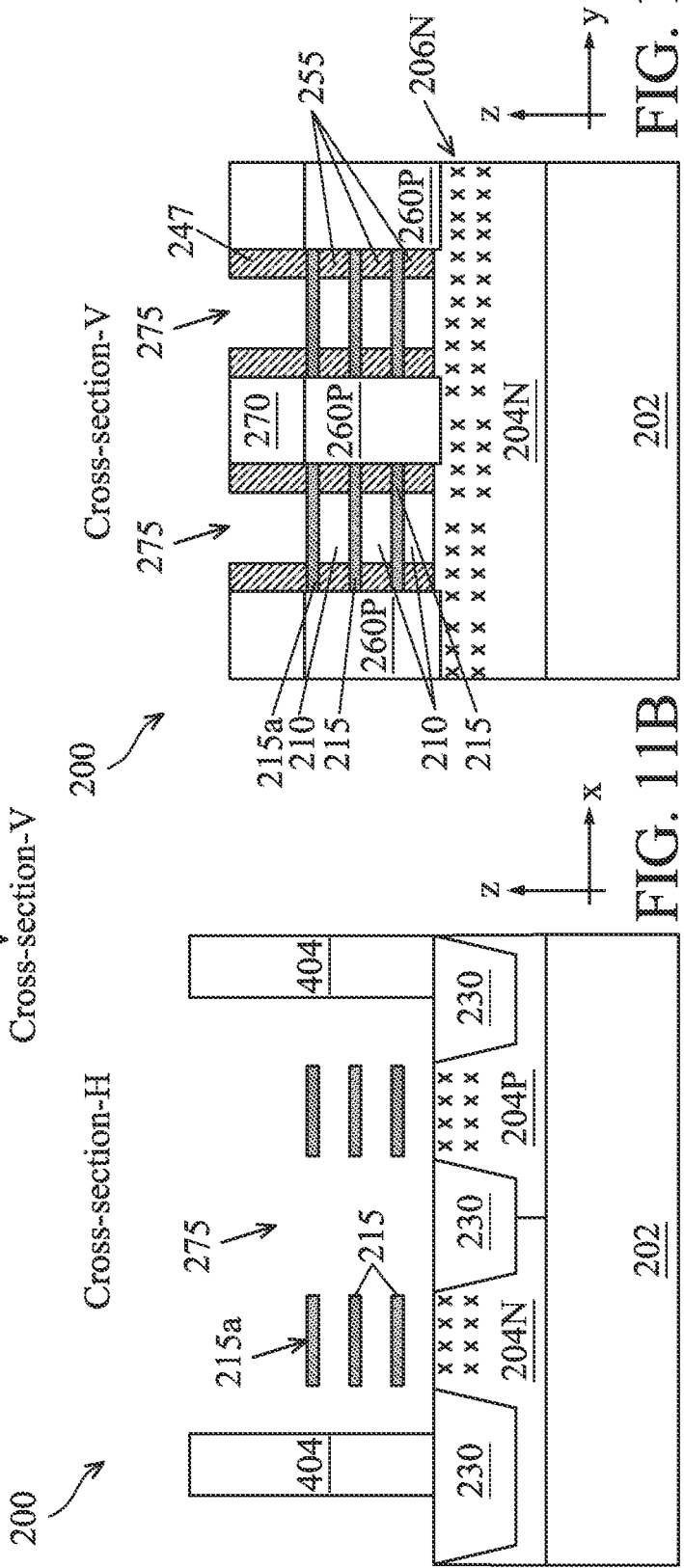

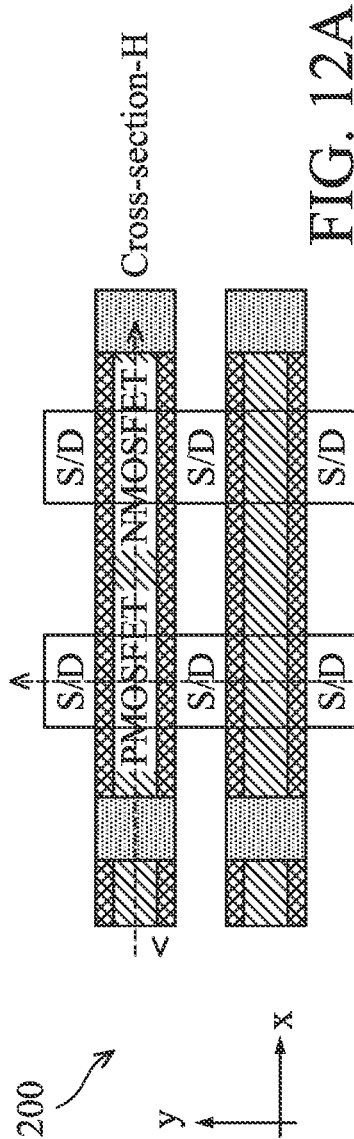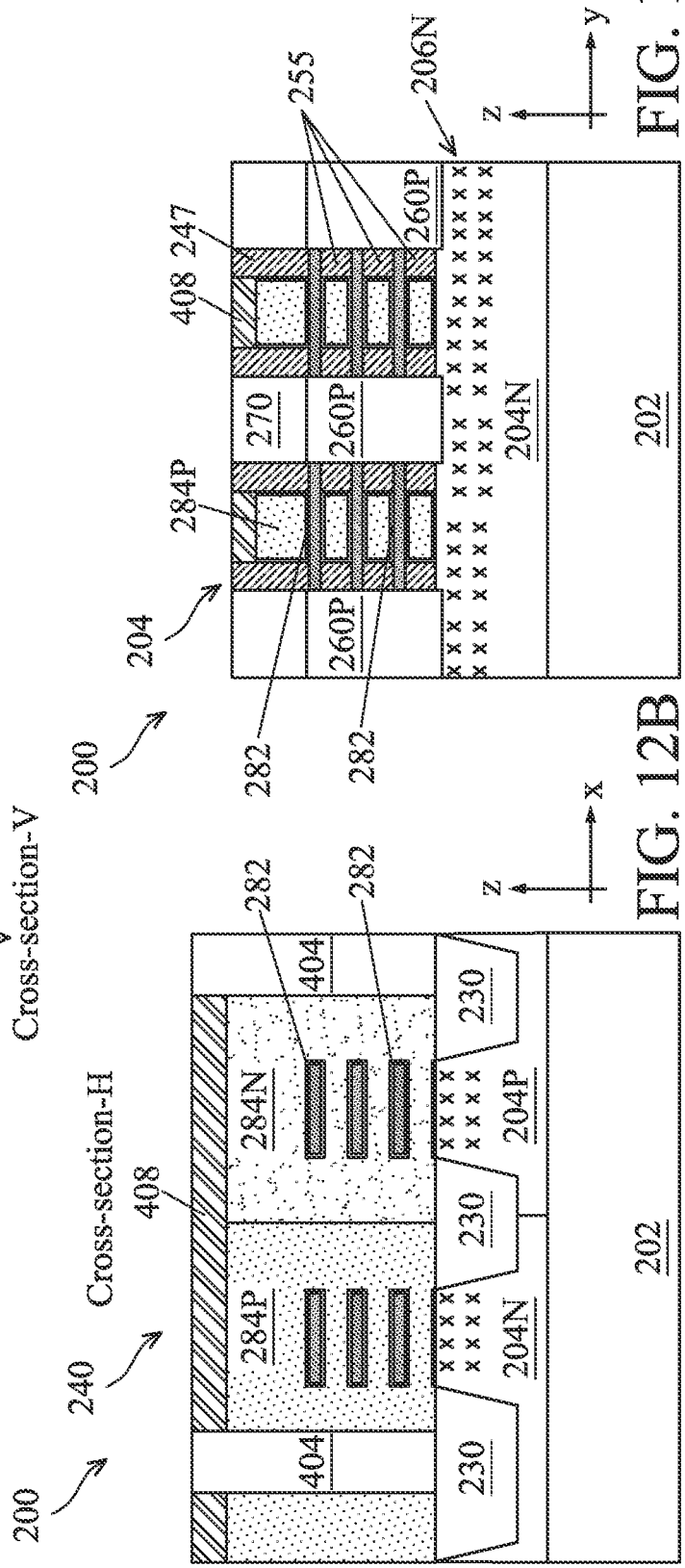

LEAKAGE REDUCTION IN GATE-ALL-AROUND DEVICES

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multi-gate devices have been introduced to improve gate control. Multi-gate devices have been observed to increase gate-channel coupling, reduce OFF-state current, and/or reduce short-channel effects (SCEs). One such multi-gate device is the gate-all around (GAA) device, referring to vertically-stacked horizontally-oriented multi-channel transistors, such as nanowire transistors and nanosheet transistors. GAA devices enable aggressive down-scaling of IC technologies, maintaining gate control and mitigating SCEs, while seamlessly integrating with conventional IC manufacturing processes. However, there are also challenges in GAA devices. One such challenge is how to control the leakage current in semiconductor layer(s) that is not fully surrounded by a gate, such as the semiconductor layer below the bottommost nanosheet or nanowire. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 is a flow chart of a method for fabricating a GAA device according to some embodiments of the present disclosure.

FIGS. 4, 5, 6, 7B, 7C, 8B, 8C, 9B, 9C, 10B, 10C, 11B, 11C, 12B, and 12C are fragmentary diagrammatic cross-sectional views of a GAA device, in portion, at various fabrication stages (such as those associated with the method in FIG. 3) according to various aspects of the present disclosure.

FIGS. 7A, 8A, 9A, 10A, 11A, and 12A are fragmentary diagrammatic top views of a GAA device, in portion, at various fabrication stages (such as those associated with the method in FIG. 3) according to various aspects of the present disclosure.

DETAILED DESCRIPTION

Figure 1A:
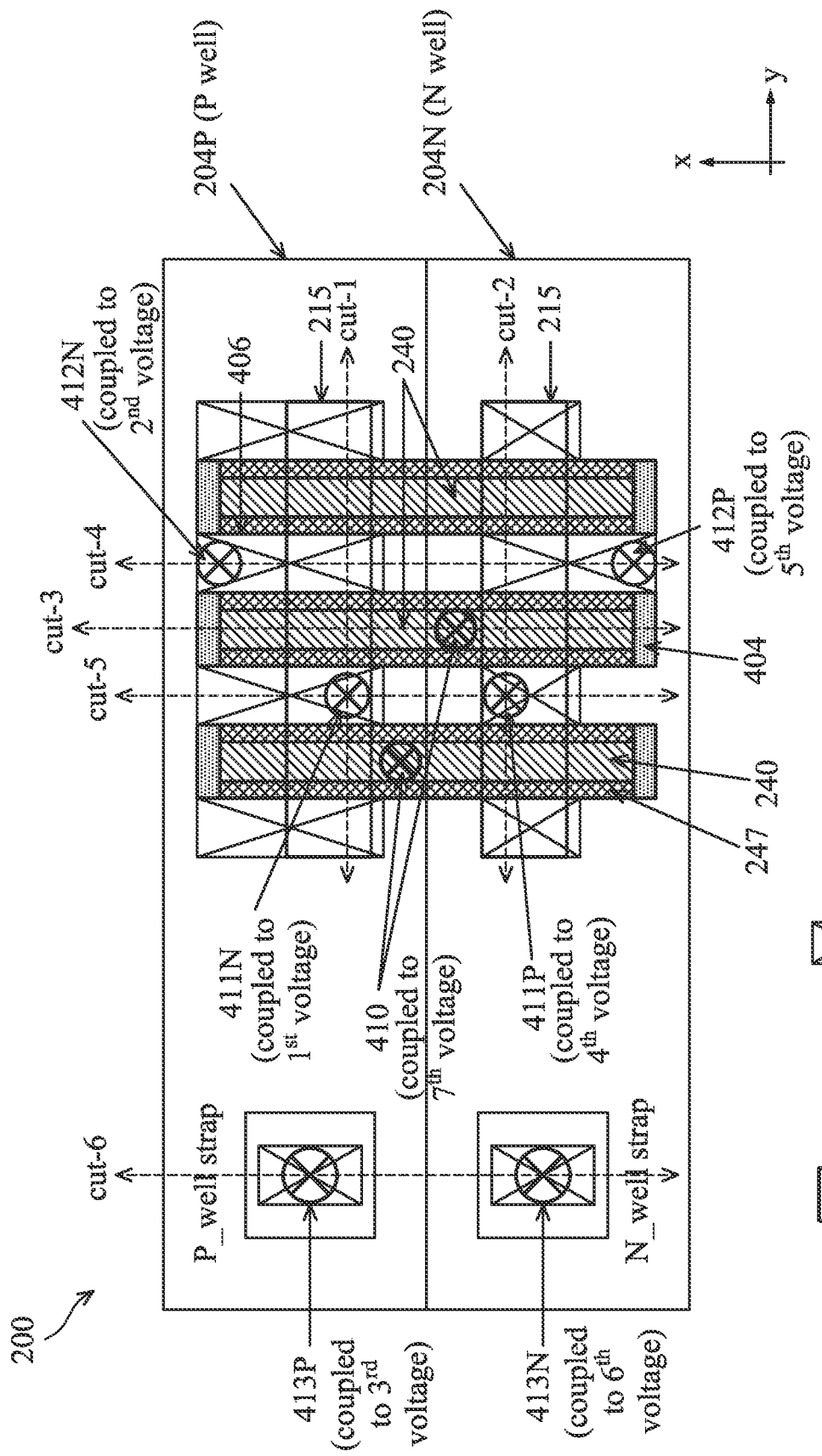
FIG. 1A is a top view of a layout of a GAA device, in portion, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application relates to a semiconductor fabrication process and the structure thereof, and more particularly to gate-all-around (GAA) devices such as vertically-stacked gate-all-around horizontal nanowire or nanosheet MOSFET devices with extremely narrow cylindrical or sheet channel body. GAA devices are promising to take CMOS to the next stage of the roadmap due to good gate control ability, lower leakage current, shrink capability, and fully FinFET device layout compatibility. However, various aspects of GAA devices still need improvements. For example, in some implementations, there is a semiconductor layer below the bottommost channel layer and disposed between a source and a drain. Part of the gate electrode surrounding the bottommost channel layer is also disposed upon this semiconductor layer, resulting in a conducting channel through this semiconductor layer, similar to a planar transistor. This planar conducting channel is unwanted for several reasons. For example, its threshold voltage may not match the nanowire/nanosheet channels, and the leakage current through this semiconductor layer could be an issue for some applications. For example, this leakage current directly contributes to excessive power consumption when a device is in standby (or non-active) mode. The general purposes of the present disclosure include providing an anti-punch-through (APT) doping in this semiconductor layer (referred to as an APT layer) for reducing the leakage current. The doping concentration of the APT layer is controlled in a range such that it is sufficiently high for suppressing the leakage current while sufficiently low for minimizing dopant diffusion into the channel layers during APT ion implantation and during subsequent thermal processes. In some embodiments, the APT layer works in conjunction with proper biasing to the source terminals, drain terminals, and the wells (P wells and N wells) to reduce the leakage current. In some embodiments, contact and via structures for the source, drain, and gate terminals are designed with low resistance metal compositions to reduce IR drop through these structures. The details of the structure and fabrication methods of the present disclosure are described below in conjunction with the accompanied drawings, which illustrate a GAA device 200 and the process of making the same, according to some embodiments. Those of ordinary skill in the art should appreciate that they may readily use the present disclosure as a basis for designing or modifying other processes and structures for carrying out the same purposes and/or achieving the same advantages of the embodiments introduced herein.

This application relates to a semiconductor fabrication process and the structure thereof, and more particularly to gate-all-around (GAA) devices such as vertically-stacked gate-all-around horizontal nanowire or nanosheet MOSFET devices with extremely narrow cylindrical or sheet channel body. GAA devices are promising to take CMOS to the next stage of the roadmap due to good gate control ability, lower leakage current, shrink capability, and fully FinFET device layout compatibility. However, various aspects of GAA devices still need improvements. For example, in some implementations, there is a semiconductor layer below the bottommost channel layer and disposed between a source and a drain. Part of the gate electrode surrounding the bottommost channel layer is also disposed upon this semiconductor layer, resulting in a conducting channel through this semiconductor layer, similar to a planar transistor. This planar conducting channel is unwanted for several reasons. For example, its threshold voltage may not match the nanowire/nanosheet channels, and the leakage current through this semiconductor layer could be an issue for some applications. For example, this leakage current directly contributes to excessive power consumption when a device is in standby (or non-active) mode. The general purposes of the present disclosure include providing an anti-punch-through (APT) doping in this semiconductor layer (referred to as an APT layer) for reducing the leakage current. The doping concentration of the APT layer is controlled in a range such that it is sufficiently high for suppressing the leakage current while sufficiently low for minimizing dopant diffusion into the channel layers during APT ion implantation and during subsequent thermal processes. In some embodiments, the APT layer works in conjunction with proper biasing to the source terminals, drain terminals, and the wells (P wells and N wells) to reduce the leakage current. In some embodiments, contact and via structures for the source, drain, and gate terminals are designed with low resistance metal compositions to reduce IR drop through these structures. The details of the structure and fabrication methods of the present disclosure are described below in conjunction with the accompanied drawings, which illustrate a GAA device 200 and the process of making the same, according to some embodiments. Those of ordinary skill in the art should appreciate that they may readily use the present disclosure as a basis for designing or modifying other processes and structures for carrying out the same purposes and/or achieving the same advantages of the embodiments introduced herein.

Figure 1B:
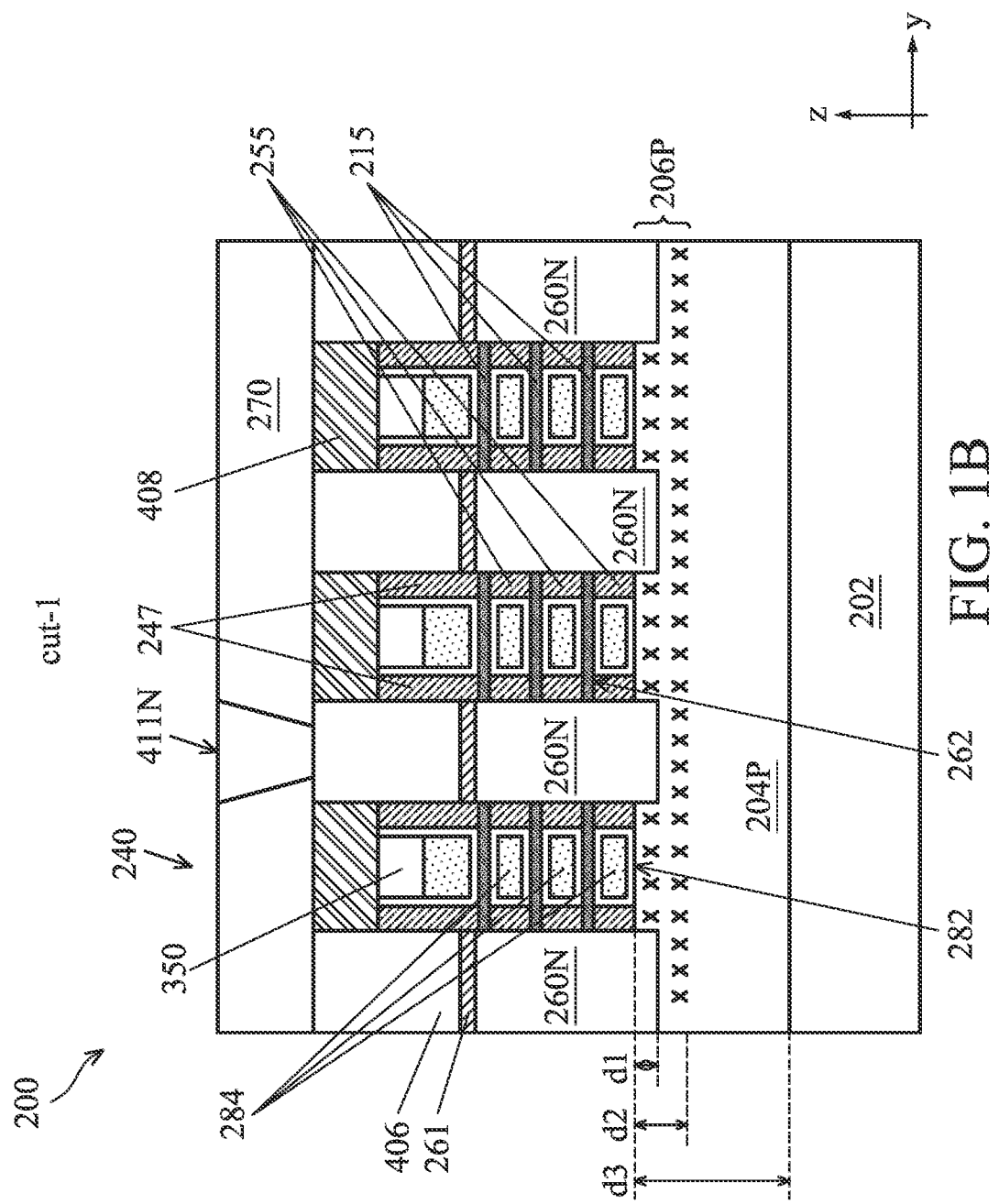
FIGS. 1B, 1C, 1E, 1F, and 1G are diagrammatic cross-sectional views of the GAA device in FIG. 1A, in portion, along the "cut-1" line, the "cut-2" line, the "cut-4" line, the "cut-5" line, and the "cut-6" line in FIG. 1A respectively, according to some embodiments of the present disclosure.
Figure 1C:
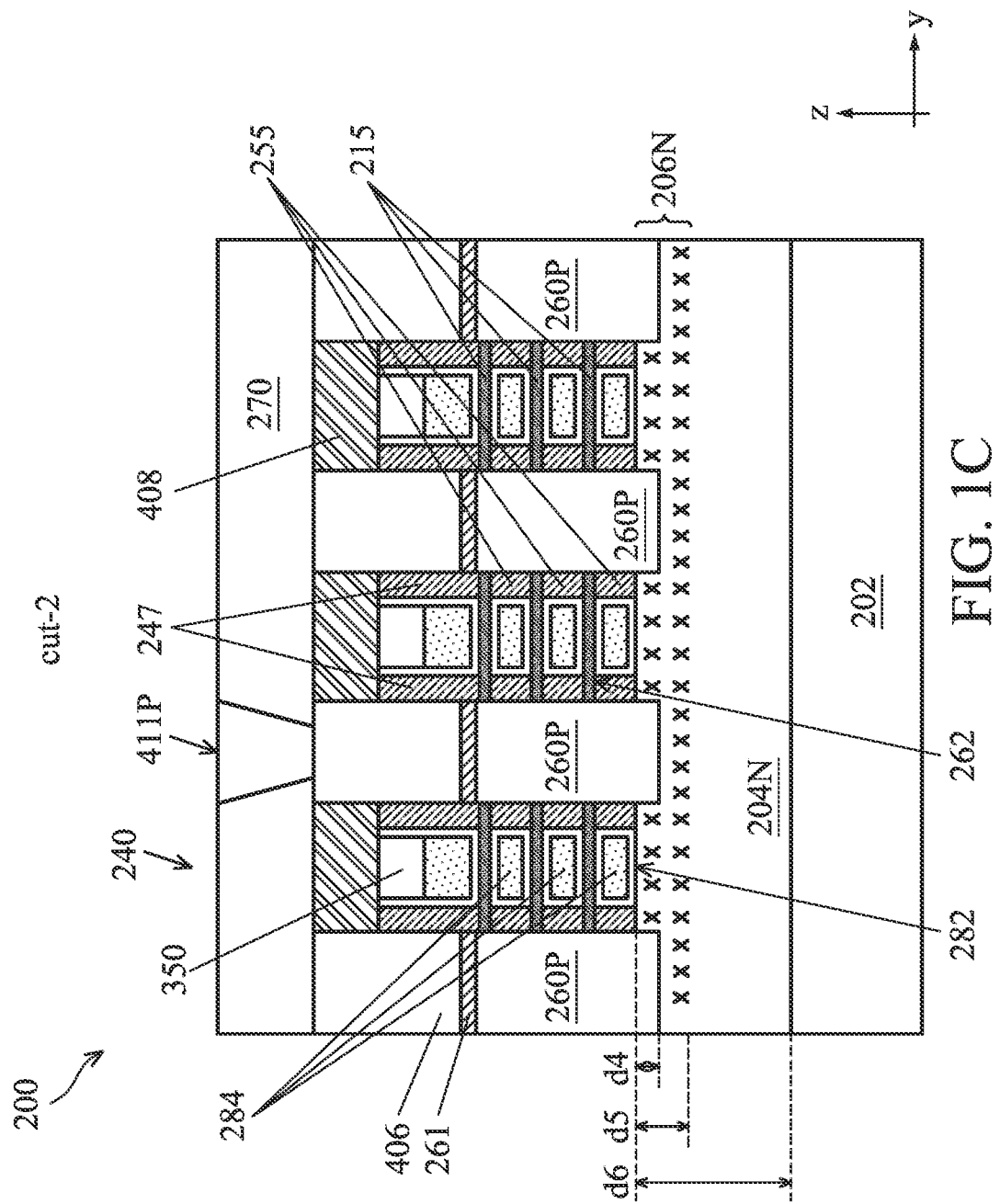
Figures 1, 1D:
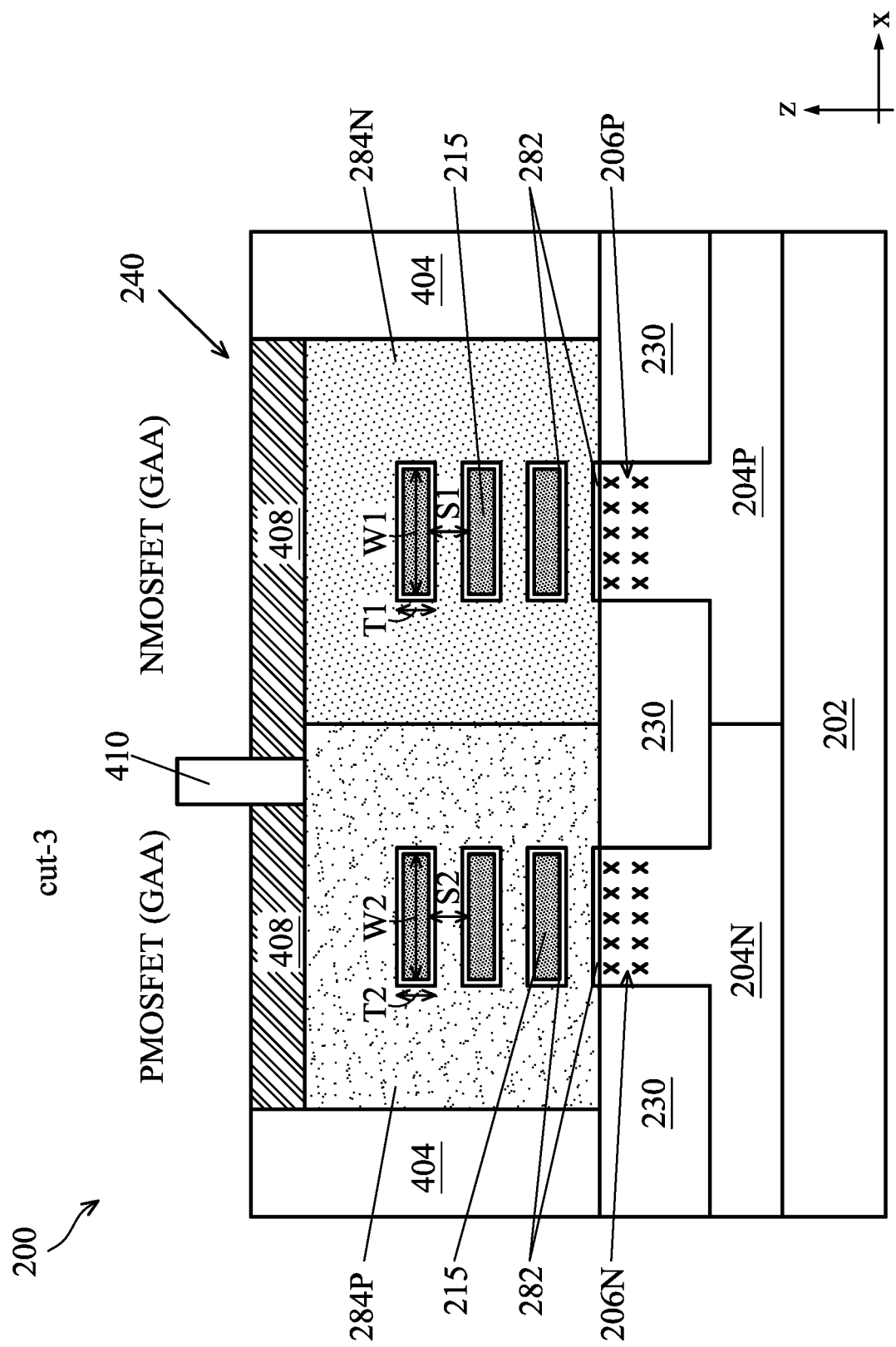
FIGS. 1D-1, 1D-2, 1D-3, and 1D-4 are diagrammatic cross-sectional views of the GAA device in FIG. 1A, in portion, along the "cut-3" line in FIG. 1A, according to some embodiments of the present disclosure.
Figures 1, 1D, 2:
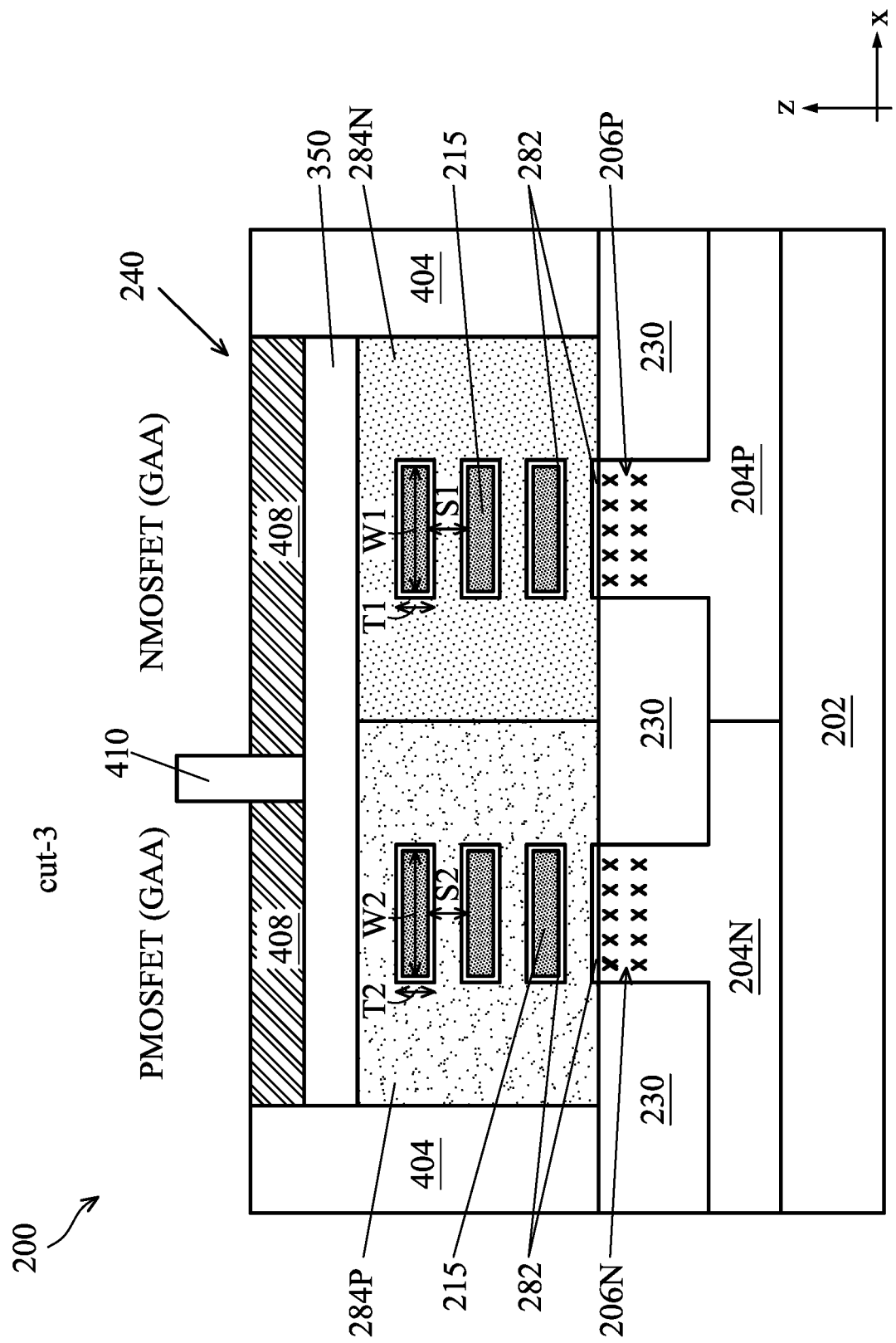
Figures 1, 1D, 2, 3:
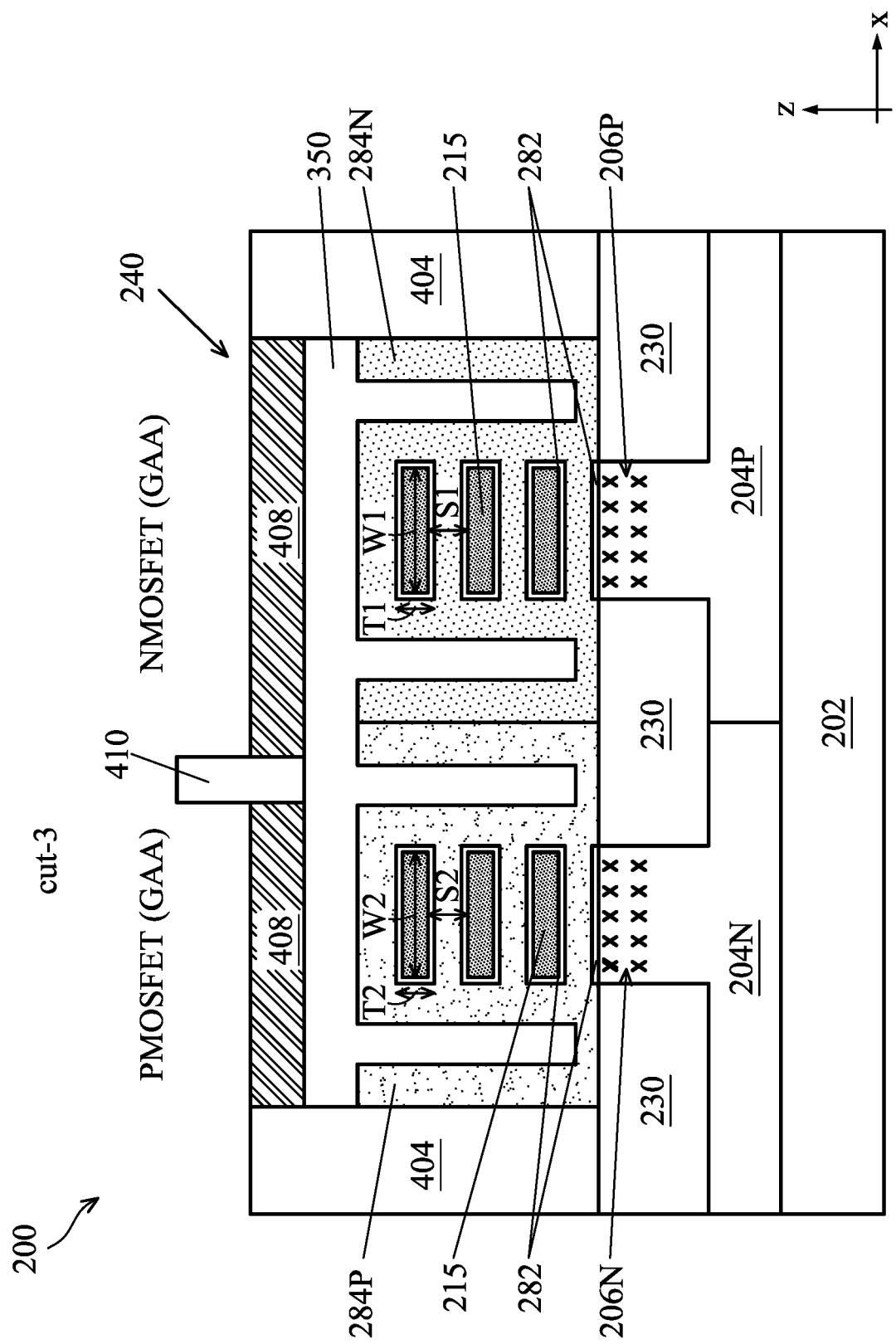
Figures 1, 1D, 2, 3, 4:
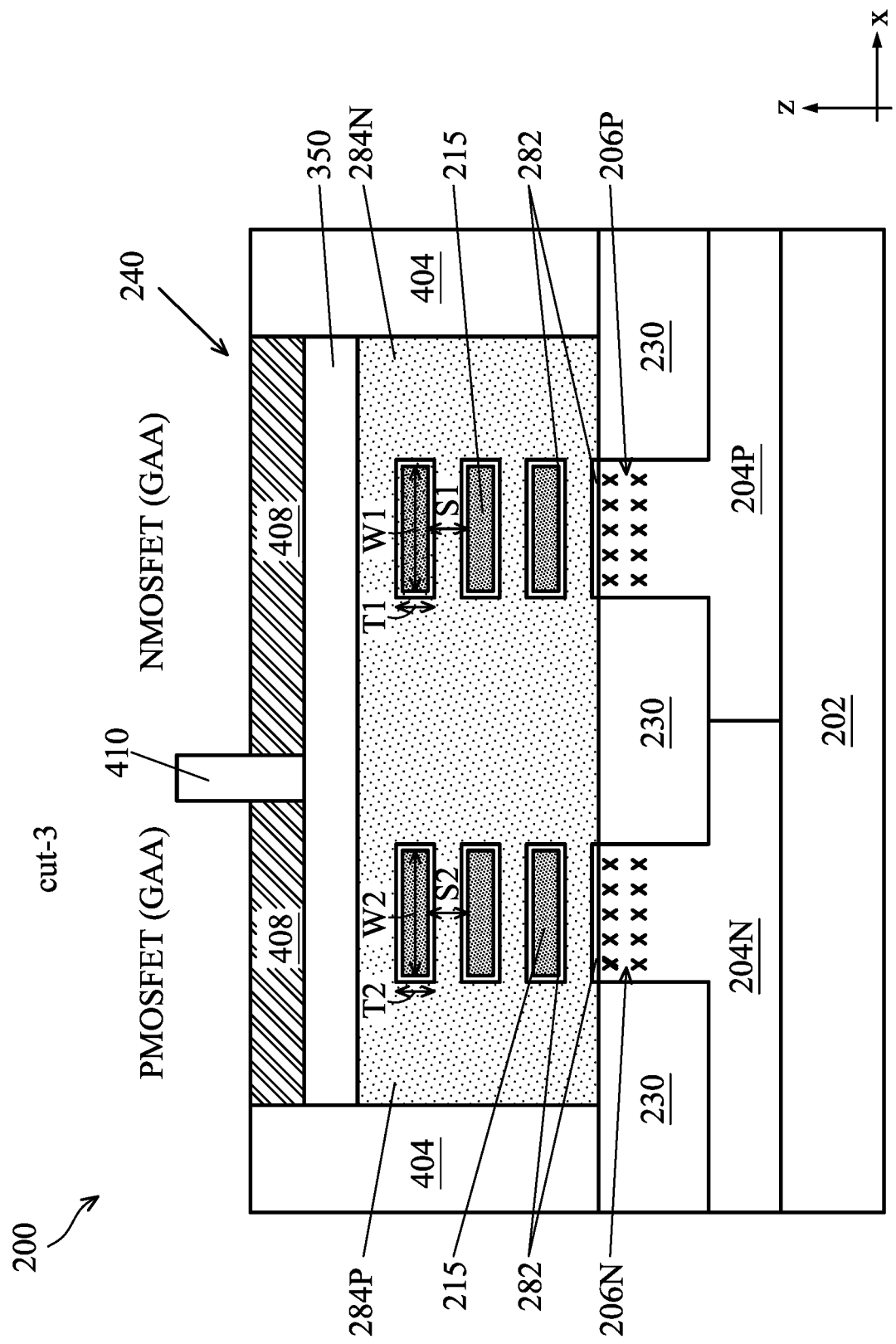
Figure 1E:
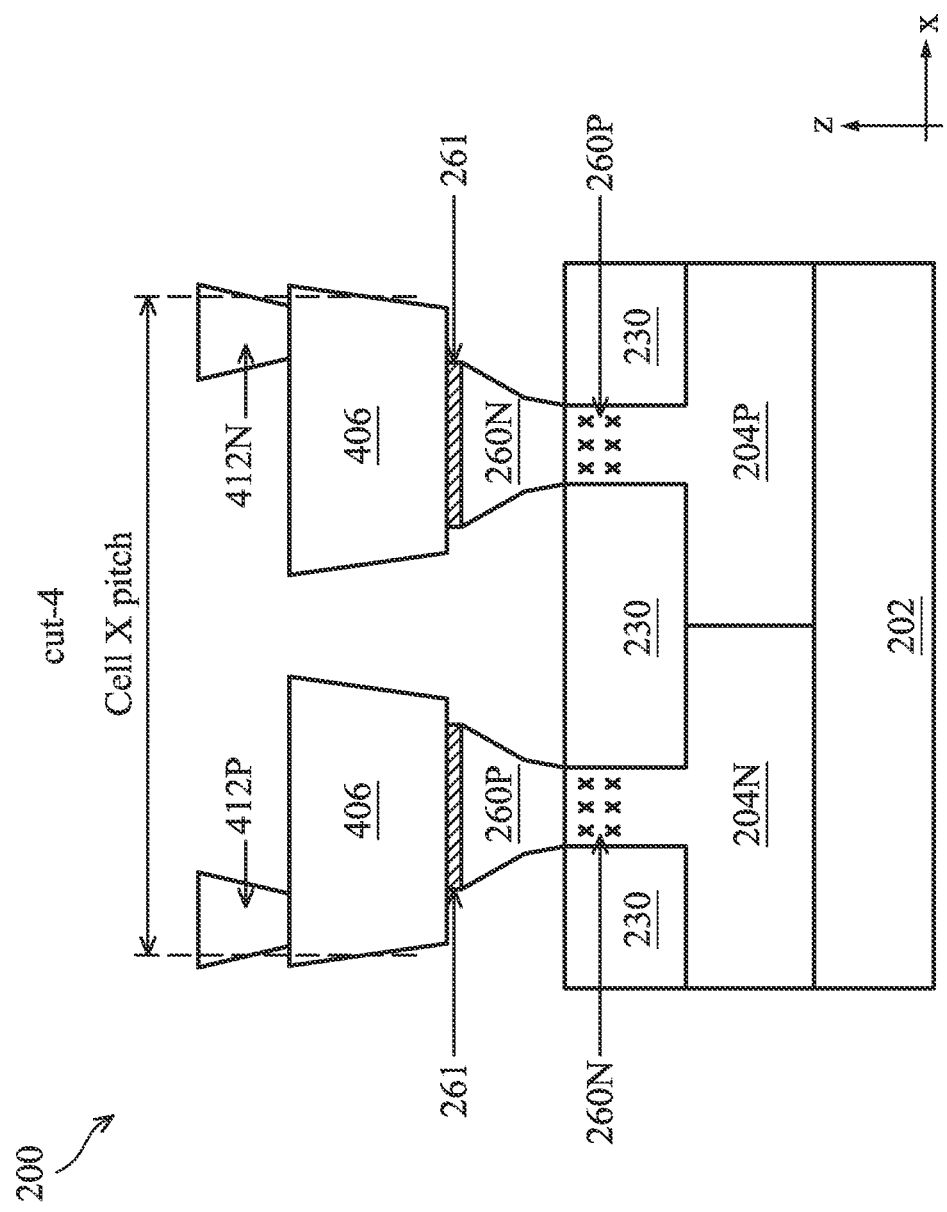
Figure 1F:
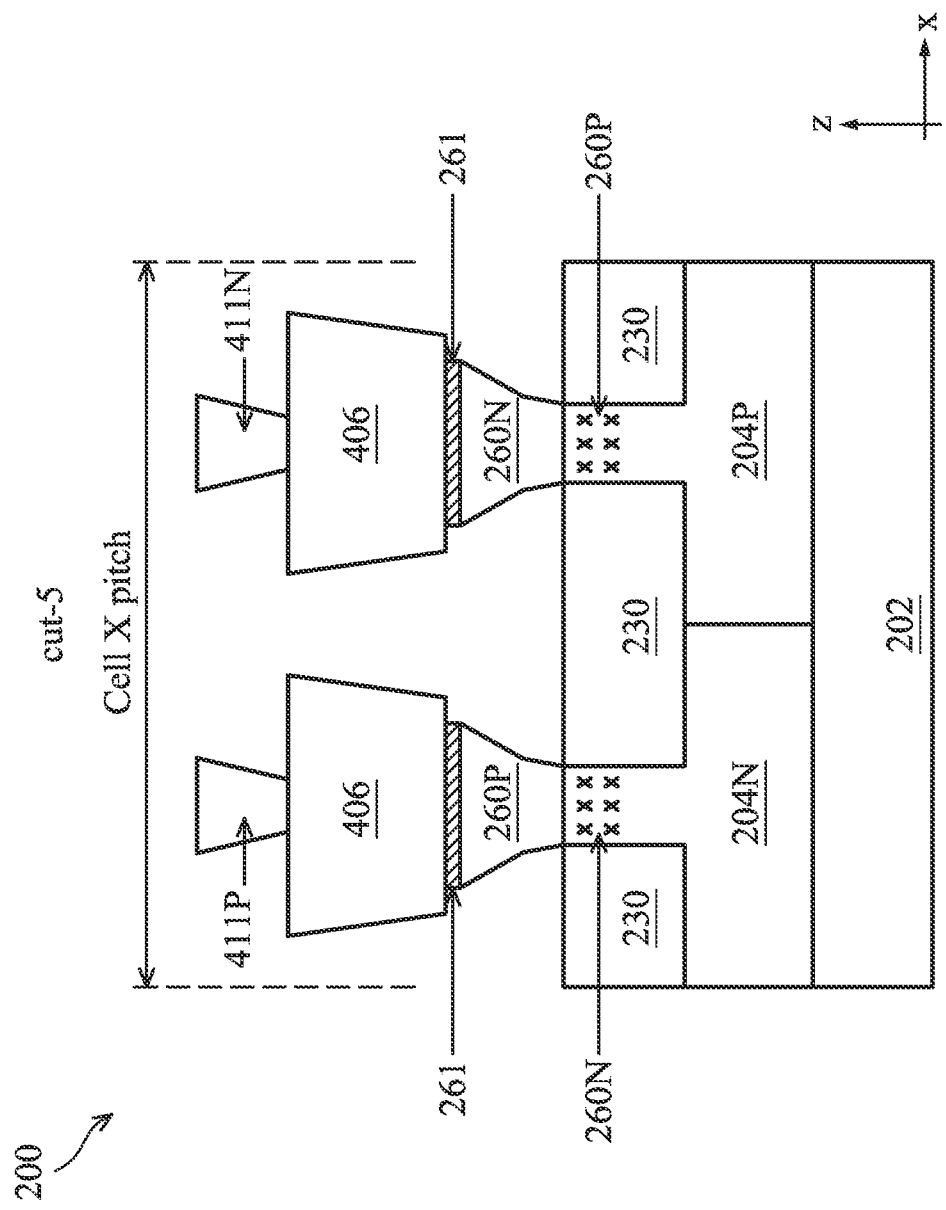
Figure 1G:
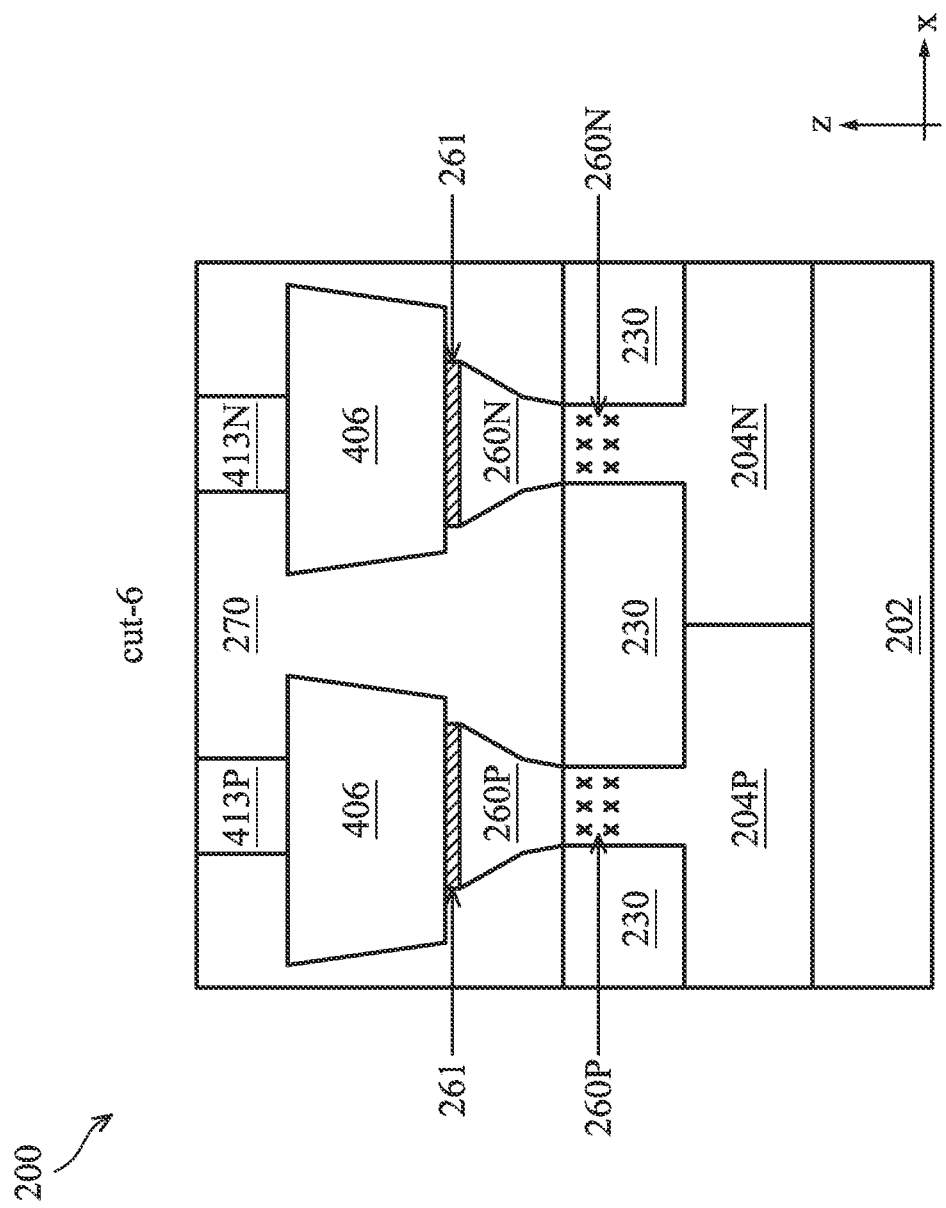
Figure 2A:
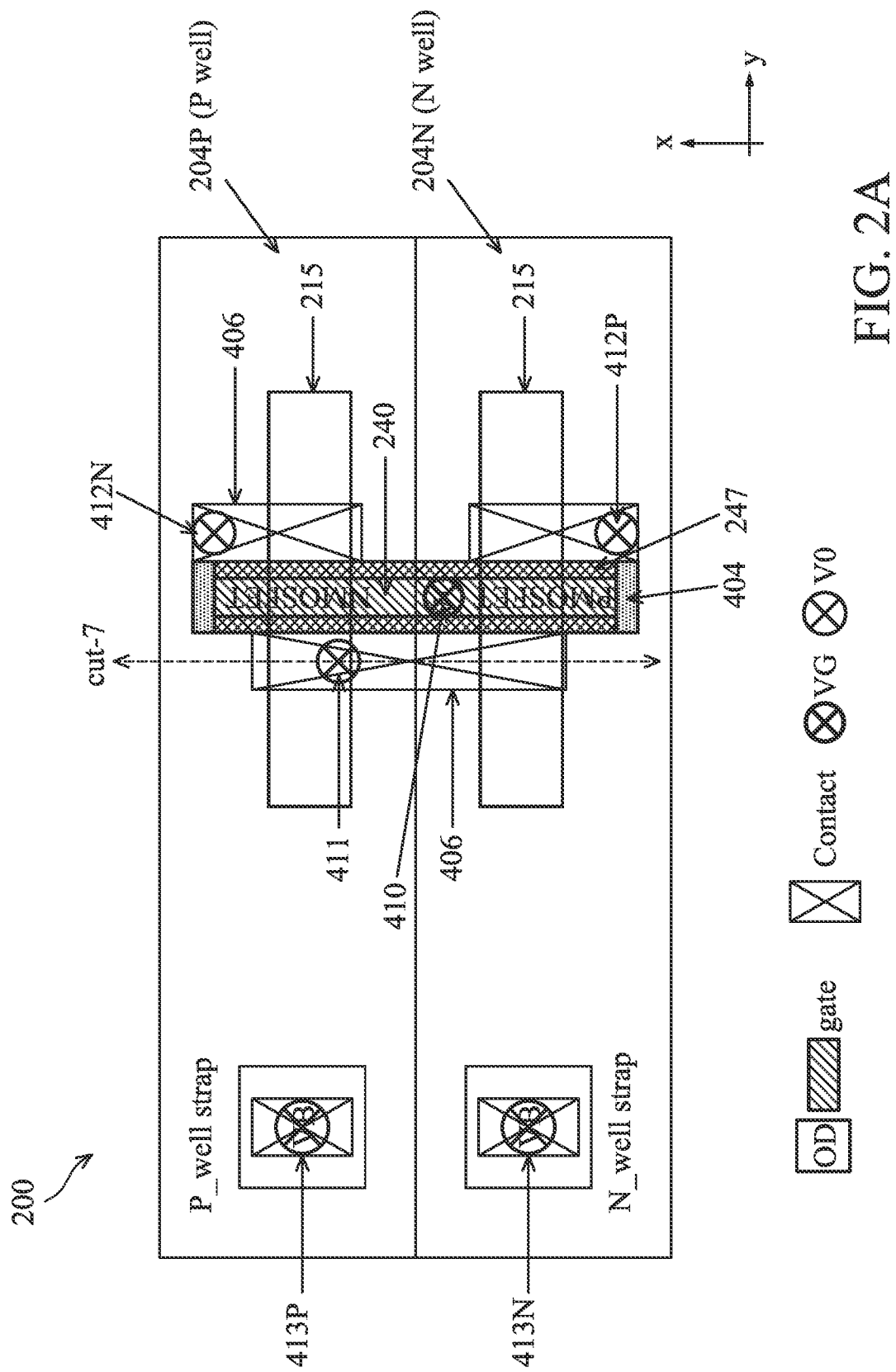
FIG. 2A is a top view of a layout of a GAA device, in portion, according to an embodiment of the present disclosure.
Figure 2B:
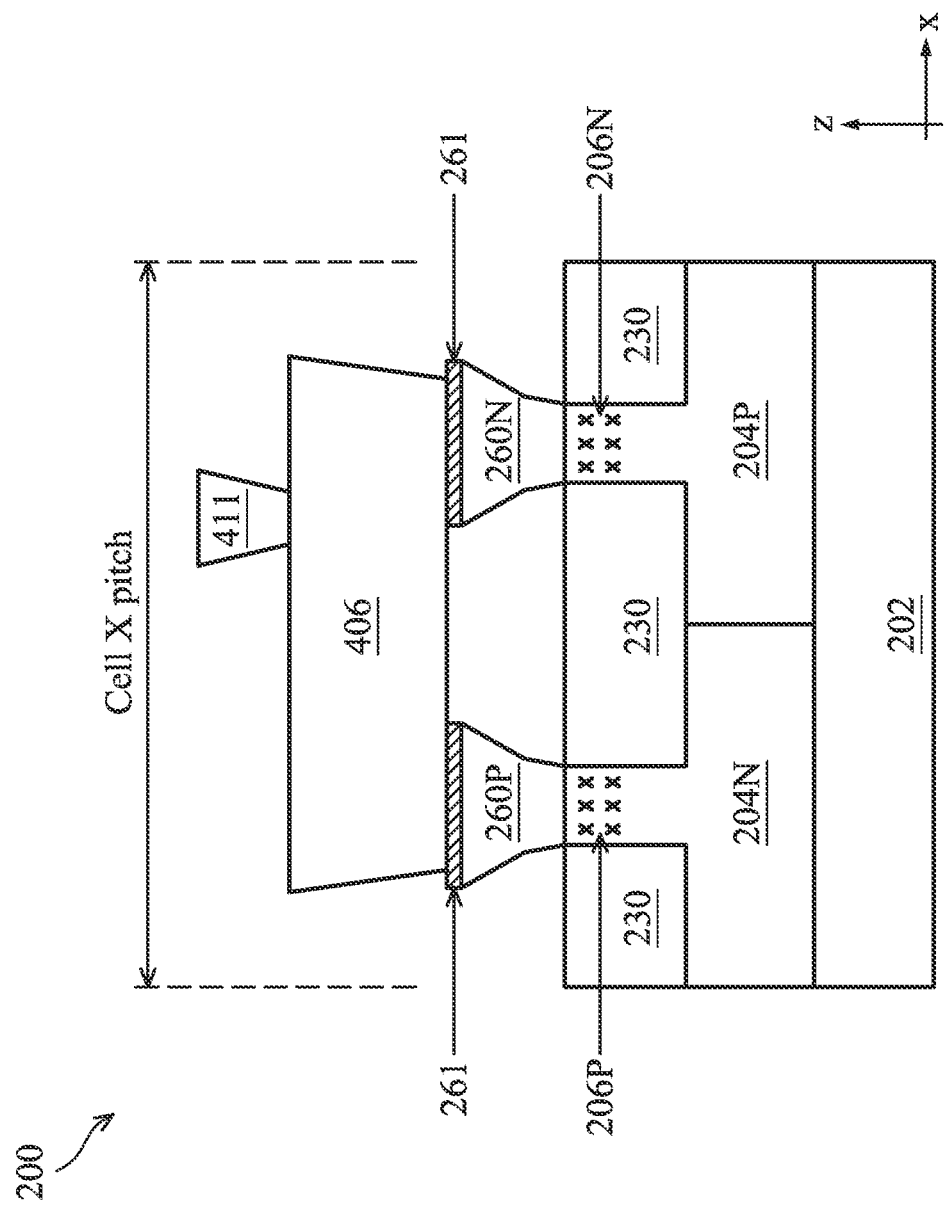
FIG. 2B is a diagrammatic cross-sectional view of the GAA device in FIG. 2A, in portion, along the "cut-7" line in FIG. 2A, according to some embodiments of the present disclosure.
Figure 3:
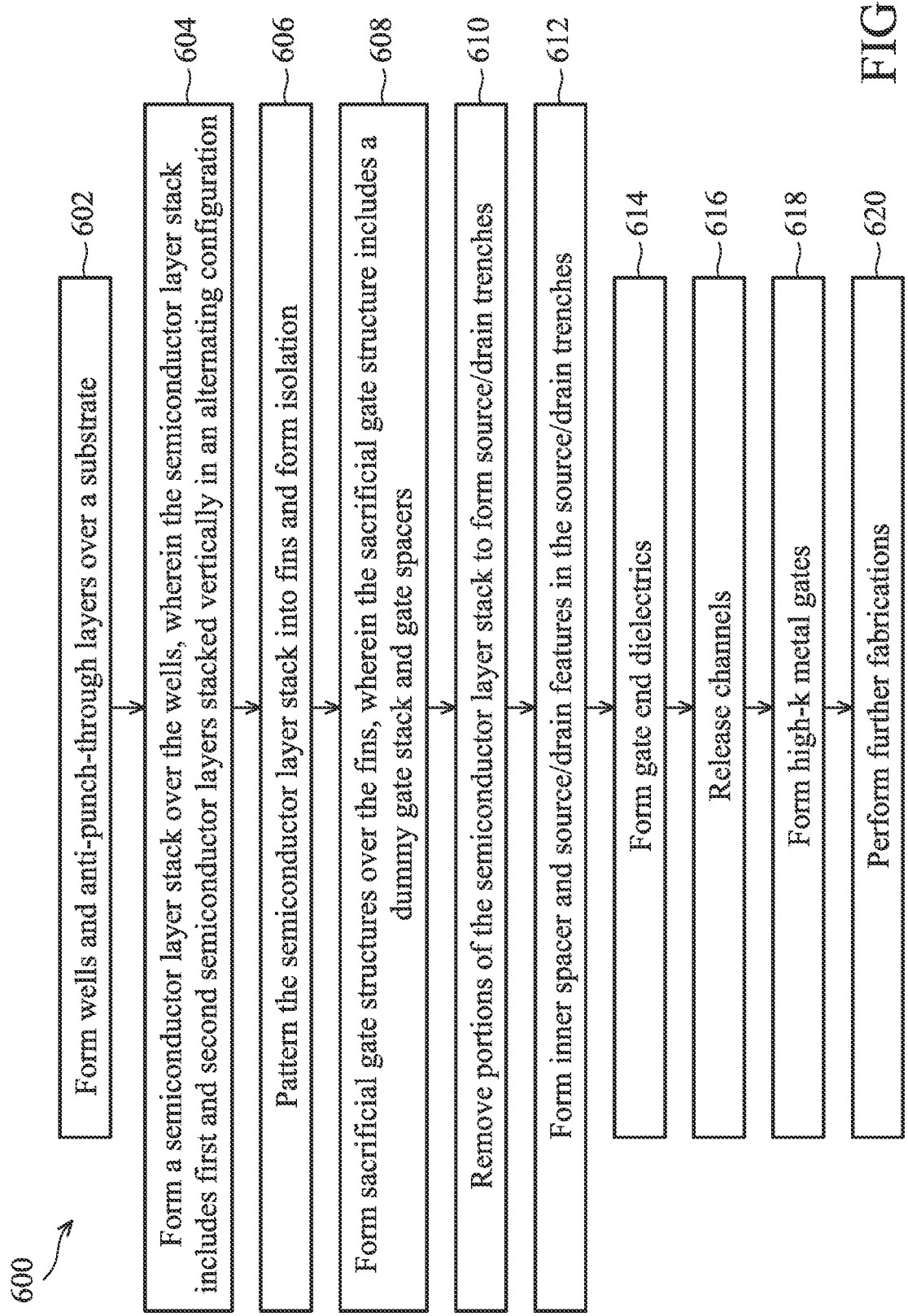

FIGS. 1A-2B are fragmentary diagrammatic views of the GAA device 200, in portion, according to some embodiments of the present disclosure. FIGS. 1A and 2A are top views of the device 200 in an X-Y plane. FIGS. 1B, 1C, 1E, 1F, and 1G are diagrammatic cross-sectional views of the GAA device in FIG. 1A, in portion, along the "cut-1" line, the "cut-2" line, the "cut-4" line, the "cut-5" line, and the "cut-6" line in FIG. 1A respectively, according to some embodiments of the present disclosure. FIGS. 1D-1, 1D-2, 1D-3, and 1D-4 are diagrammatic cross-sectional views of the GAA device in FIG. 1A, in portion, along the "cut-3" line in FIG. 1A, according to some embodiments of the present disclosure. FIG. 2B is a diagrammatic cross-sectional view of the GAA device in FIG. 2A, in portion, along the "cut-7" line in FIG. 2A, according to some embodiments of the present disclosure.

In some embodiments, the device 200 may be included in a microprocessor, a memory, and/or other IC device. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 1A through 2B have been simplified for the sake of clarity to better understand the inventive concepts of the present disclosure. Additional features can be added in the device 200, and some of the features described below can be replaced, modified, or eliminated in other embodiments of the device 200.

Turning to FIGS. 1A, 1B, and 1C, the device 200 includes a substrate 202 and multiple wells, such as an N well (or n-type well) 204N and a P well (or p-type well) 204P, formed in or on the substrate 202. As shown in FIGS. 1B and 1C, an anti-punch-through (APT) layer 206N is provided in the top section of the well 204N and an APT layer 206P is provided in the top section of the well 204P. A stack of channel layers 215 are disposed over the APT layer 206N and another stack of channel layers 215 are disposed over the APT layer 206P. The channel layers 215 are oriented lengthwise along the "y" direction and widthwise along the "x" direction. The device 200 further includes gate stacks (such as high-k metal gate stacks) 240 that are oriented lengthwise along the "x" direction and engage the channel layers 215 to form GAA transistors. Particularly, each gate stack 240 wraps around the respective channel layers 215. The device 200 further includes gate spacers 247 on sidewalls of the gate stacks 240 and gate-end dielectric features 404 at both ends of each gate stack 240. As shown in FIG. 1A, the device 200 further includes contacts (such as contacts 406 in FIGS. 1B and 1C) disposed over source/drain regions between the adjacent gate spacers 247 and various vias including source vias 412N and 412P, drain vias 411N and 411P, and gate via 410. As shown in FIG. 1A, the device 200 further includes well strap cells (or well pickup cells) "P well strap" and "N-well strap" and conductive features for connecting to the well strap cells including vias 413N and 413P. The vias 411N, 412N, 413P, 411P, 412P, 413N, and 410 are coupled to first, second, third, fourth, fifth, sixth, and seventh voltages, respectively. The details of these and other components of the device 200 are further described below.

In an embodiment, substrate 202 includes silicon, such as a silicon wafer. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In the present embodiment, the P wells 204P and the N wells 204N include the same semiconductor material(s) as the substrate 202. The P wells 204P are further doped with p-type dopants, such as boron, indium, other p-type dopant, or combinations thereof, configured for n-type GAA transistors. The N wells 204N are further doped with n-type dopants, such as phosphorus, arsenic, other n-type dopant, or combinations thereof, configured for p-type GAA transistors. In some implementations, the wells 204N are formed with a combination of p-type dopants and n-type dopants but with a net effect of being n-type doped. In some implementations, the wells 204P are formed with a combination of p-type dopants and n-type dopants but with a net effect of being p-type doped. The various doped regions can be formed directly on and/or in substrate 202, by an ion implantation process, a diffusion process, and/or other suitable doping process. Referring to FIG. 1B, in the present embodiment, the well 204P has a depth d3 measured from the top surface of the APT layer 206P (which is considered as part of the well 204P). The depth d3 may be up to 300 nm in some embodiments, such as from about 100 nm to about 400 nm. The dopant concentration in the well 204P may be in a range of about 1E16 atom/cm$^3$ to about 1E19 atom/cm$^3$ in some embodiments, depending on well resistance requirements. Referring to FIG. 1C, in the present embodiment, the well 204N has a depth d6 measured from the top surface of the APT layer 206N (which is considered as part of the well 204N). The depth d6 may be up to 300 nm in some embodiments, such as from about 100 nm to about 400 nm. The dopant concentration in the well 204N may be in a range of about 1E16 atom/cm$^3$ to about 1E19 atom/cm$^3$ in some embodiments, depending on well resistance requirements.

In the present embodiment, the APT layer 206P includes the same semiconductor material(s) as the well 204P and is considered as part of the P well 204P. But the APT layer 206P is more heavily doped with p-type dopants (such as boron, indium, other p-type dopant, or combinations thereof) than the P well 204P. For example, a ratio of the dopant concentration in the APT layer 206P to the dopant concentration in the P well layer 204P is controlled to be in a range from about 2 to about 100 in some embodiments. This ratio and the doping concentration of the APT layer 206P are controlled such that the APT layer 206P is doped sufficiently heavy for suppressing the leakage current between the source/drain features 260N and through the APT layer 206P (see FIG. 1B) while sufficiently light for minimizing dopant diffusion from the APT layer 206P into the channel layers 215 during the ion implantation process(es) for forming the APT layer 206P and during subsequent thermal processes (such as S/D dopant annealing). In some embodiment, the doping concentration of the APT layer 206P is controlled in a range from about 1E17 atom/cm$^3$ to about 1E19 atom/cm$^3$ such as from about 1E17 atom/cm$^3$ to about 1E18 atom/cm$^3$ or from about 1E18 atom/cm$^3$ to about 1E19 atom/cm$^3$. For example, if the doping concentration of the APT layer 206P is below about 1E17 atom/cm$^3$, it might not be effective in suppressing the leakage current therethrough; and if the doping concentration of the APT layer 206P is above about 1E19 atom/cm$^3$, then the p-type dopants for implanting into the APT layer 206P might also be implanted into the channel layer 215 or the p-type dopants in the APT layer 206P might diffuse into the channel layers 215 during thermal processes. In either case, such unintentional doping of the channel layers 215 might lead to non-uniform performance among the channel layers 215 for the same GAA transistor or non-uniform performance among different GAA transistors. In an embodiment, to avoid such non-uniformity caused by the APT layer 206P, the APT layer 206P is doped with a relatively low dopant concentration (but still more heavily doped than the P well 204P) such as in a range from about 1E17 atom/cm$^3$ to about 1E19 atom/cm$^3$, and then the source and drain terminals of the NMOS GAA transistors and the well 204P are properly biased to supplement the APT layer 206P and to further suppress the leakage current.

For example, referring to FIG. 1A, during a standby mode (or static mode or non-active mode) of the device 200 or a standby mode of an NMOS GAA transistor, the drain terminal of the NMOS GAA transistor is coupled to a first voltage (through the via 411N) that is a positive supply voltage (such as from about 0.4V to about 1V in some embodiments), the source terminal of the NMOS GAA transistor is coupled to a second voltage (through the via 412N) that is ground (or a negative supply voltage in some embodiments), and the well 204P is coupled to a third voltage (through the via 413P) that is lower than the second voltage. For example, the third voltage is lower than the second voltage by about 0.1V to about 0.6V in some embodiments. In some embodiments, the second voltage may be slightly higher than 0V such as within a range of 0V to 0.1V due to IR drop induced voltage shift. In some embodiments, the third voltage is negative such as in a range of −0.1V to −0.6V. The APT layer 206P is biased to the third voltage as a result of the well 204P being biased. Since the PN junction between the source feature 260N of the NMOS GAA (see FIG. 1B) and the well 204P is reversely biased, the leakage current through this PN junction is reduced. During an operation mode (or active mode) of the device 200, the source terminal of the NMOS GAA transistor and the well 204P are coupled to substantially the same voltage level (i.e., the second voltage is substantially equal to the third voltage) so that normal transistor operations resume.

With this biasing scheme, the APT layer 206P needs not be heavily doped, thus protecting the channel layers 215 from being unintentionally doped with the p-type dopants.

In an alternative embodiment, the biasing voltages for the standby mode of an NMOS GAA transistor may be configured as follows: the first voltage is electrically coupled to the second voltage while the NMOS GAA transistor's gate is tied to a positive supply voltage (such as about 0.4V to about 1V) through a via 410 to turn off the NMOS GAA transistor; the second voltage is set to ground or a negative supply voltage; and the third voltage is set to a value lower than the second voltage. For example, the third voltage is lower than the second voltage by about 0.1V to about 0.6V in some embodiments. Similar effect as discussed above can be achieved.

Referring to FIG. 1B, in the present embodiment, the APT layer 206P has a depth d2 measured from the top surface of the APT layer 206P (which interfaces with the gate dielectric layer 282). The depth d2 may be up to 40 nm in some embodiments, such as from about 5 nm to about 50 nm. The depth d2 is less the depth d3 in various embodiments.

In the present embodiment, the APT layer 206N includes the same semiconductor material(s) as the well 204N and is considered as part of the N well 204N. But the APT layer 206N is more heavily doped with n-type dopants (such as phosphorus, arsenic, other n-type dopant, or combinations thereof) than the N well 204N. For example, a ratio of the dopant concentration in the APT layer 206N to the dopant concentration in the N well layer 204N is controlled to be in a range from about 2 to about 100 in some embodiments. This ratio and the doping concentration of the APT layer 206N are controlled such that the APT layer 206N is doped sufficiently heavy for suppressing the leakage current between the source/drain features 260P and through the APT layer 206N (see FIG. 1C) while sufficiently light for minimizing dopant diffusion from the APT layer 206N into the channel layers 215 during the ion implantation process(es) for forming the APT layer 206N and during subsequent thermal processes (such as S/D dopant annealing). In some embodiment, the doping concentration of the APT layer 206N is controlled in a range from about $1E17$ atom/cm$^3$ to about $1E19$ atom/cm$^3$ such as from about $1E17$ atom/cm$^3$ to about $1E18$ atom/cm$^3$ or from about $1E18$ atom/cm$^3$ to about $1E19$ atom/cm$^3$. For example, if the doping concentration of the APT layer 206N is below about $1E17$ atom/cm$^3$, then it might not be effective in suppressing the leakage current therethrough; and if the doping concentration of the APT layer 206N is above about $1E19$ atom/cm$^3$, then the n-type dopants for implanting into the APT layer 206N might also be implanted into the channel layer 215 or the n-type dopants in the APT layer 206N might diffuse into the channel layers 215 during thermal processes. In either case, such unintentional doping of the channel layers 215 might lead to non-uniform performance among the channel layers 215 for the same GAA transistor or non-uniform performance among different GAA transistors. In an embodiment, to avoid such non-uniformity caused by the APT layer 206N, the APT layer 206N is doped with a relatively low dopant concentration (but still more heavily doped than the N well 204N) such as in a range from about $1E17$ atom/cm$^3$ to about $1E19$ atom/cm$^3$, and then the source and drain terminals of the PMOS GAA transistors and the well 204N are properly biased to supplement the APT layer 206N and to further suppress the leakage current.

For example, during a standby mode (or static mode or non-active mode) of the device 200 or a standby mode of a PMOS GAA transistor, the drain terminal of the PMOS GAA transistor is coupled to a fourth voltage (through the via 411P) that is ground (or a negative supply voltage in some embodiments), the source terminal of the PMOS GAA transistor is coupled to a fifth voltage (through the via 412P) that is a positive supply voltage (such as about 0.4V to about 1V in some embodiments), and the well 204N is coupled to a sixth voltage (through the via 413N) that is higher than the fifth voltage. For example, the sixth voltage is higher than the fifth voltage by about 0.1V to about 0.6V in some embodiments. In some embodiments, the fourth voltage may be slightly higher than 0V such as within a range of 0V to 0.1V due to IR drop induced voltage shift. The APT layer 206N is biased to the sixth voltage as a result of the well 204N being biased. Since the PN junction between the source feature 260P of the PMOS GAA transistor (see FIG. 1C) and the well 204N is reversely biased, the leakage current through this PN junction is reduced. During an operation mode (or active mode) of the device 200, the source terminal of the PMOS GAA transistor and the well 204N are coupled to substantially the same voltage level (i.e., the fifth voltage is substantially equal to the sixth voltage) so that normal transistor operations resume. With this biasing scheme, the APT layer 206N needs not be heavily doped, thus protecting the channel layers 215 from being unintentionally doped (with the n-type dopants).

In an alternative embodiment, the biasing voltages for the standby mode of a PMOS GAA transistor may be configured as follows: the fourth voltage is electrically coupled to the fifth voltage while the PMOS GAA transistor's gate is tied to ground through a via 410 to turn off the PMOS GAA transistor; the fifth voltage is set to a positive supply voltage (such as about 0.4V to about 1V); and the sixth voltage is set to a value higher than the fifth voltage. For example, the sixth voltage is higher than the fifth voltage by about 0.1V to about 0.6V in some embodiments. Similar effect as discussed above can be achieved.

Referring to FIG. 1C, in the present embodiment, the APT layer 206N has a depth d5 measured from the top surface of the APT layer 206N (which interfaces with the gate dielectric layer 282). The depth d5 may be up to 40 nm in some embodiments, such as from about 5 nm to about 50 nm. The depth d5 is less than the depth d6 in various embodiments.

As shown in FIG. 1D-1 and other figures, the device 200 further includes isolation features 230 over the substrate 202 and adjacent to upper sections of the wells 204N and 204P including the APT layers 206N and 206P. Isolation features 230 may include silicon oxide, silicon nitride, silicon oxynitride, other suitable isolation material (for example, including silicon, oxygen, nitrogen, carbon, or other suitable isolation constituent), or combinations thereof. Isolation features 230 may include different structures, such as shallow trench isolation (STI) structures, deep trench isolation (DTI) structures, and/or local oxidation of silicon (LOCOS) structures. For example, isolation features 230 can include STI features that define and electrically isolate the doped regions. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

As shown in FIGS. 1B, 1C, and other figures, the device 200 further includes n-type doped source/drain features 260N disposed over the P well 204P for forming NMOS GAA transistors, and p-type doped source/drain features 260P disposed over the N well 204N for forming PMOS GAA transistors. The source/drain features 260N and 260P may be formed using epitaxial growth. For example, a semiconductor material is epitaxially grown from portions of substrate 202, the wells 204P/204N, the APT layers 206P/206N, and semiconductor layers 215, forming epitaxial source/drain features 260N and 260P. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202, the wells 204P/204N, and semiconductor layers 215. In some embodiments, the epitaxial source/drain features 260N may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain features 260P may include silicon germanium or germanium and may be doped with boron, other p-type dopant, or combinations thereof (for example, forming Si:Ge:B epitaxial source/drain features). In some embodiments, epitaxial source/drain features 260N and/or 260P include more than one epitaxial semiconductor layer, where the epitaxial semiconductor layers can include the same or different materials and/or dopant concentrations. In some embodiments, epitaxial source/drain features 260N and/or 260P include materials and/or dopants that achieve desired tensile stress and/or compressive stress in respective channel layers 215 of the GAA transistors. In some embodiments, epitaxial source/drain features 260N and 260P are doped during deposition by adding impurities to a source material of the epitaxy process (i.e., in-situ). In some embodiments, epitaxial source/drain features 260N and 260P are doped by an ion implantation process subsequent to a deposition process. In some embodiments, annealing processes (e.g., rapid thermal annealing (RTA) and/or laser annealing) are performed to activate dopants in epitaxial source/drain features 260N and 260P. In some embodiments, epitaxial source/drain features 260N and 260P are formed in separate processing sequences that include, for example, masking PMOS GAA transistor regions when forming epitaxial source/drain features 260N in NMOS GAA transistor regions and masking NMOS GAA transistor regions when forming epitaxial source/drain features 260P in PMOS GAA transistor regions.

As shown in FIG. 1B, the n-type source/drain features 260N extend below the top surface of the APT layer 206P (which is also the top surface of the well 204P) by a depth d1. In some embodiments, the depth d1 is in a range of about 5 nm to about 25 nm. If the depth d1 is too small (such as less than 5 nm) or if the n-type source/drain features 260N do not extend below the top surface of the APT layer 206P, there is a risk that a sacrificial semiconductor layer (such as SiGe) vertically between the bottommost channel layer 215 and the APT layer 206P might not be completely removed during the process of forming inner spacers 255. If this were to happen, there could be short circuit defects between the source/drain features 260N and the gate stacks 240. If the depth d1 is too large (such as more than 25 nm), there is a risk that the source/drain features 260N might extend completely through the APT layer 206P, lowering the effectiveness of the APT layer 206P and increasing leakage current. In various embodiments, the depth d1 is less than the depth d2 so that the anti-punch-through doping in the APT layer 206P fully surrounds the n-type source/drain feature 260N for effective suppression of leakage current.

As shown in FIG. 1C, the p-type source/drain features 260P extend below the top surface of the APT layer 206N (which is also the top surface of the well 204N) by a depth d4. In some embodiments, the depth d4 is in a range of about 5 nm to about 25 nm. If the depth d4 is too small (such as less than 5 nm) or if the p-type source/drain features 260P do not extend below the top surface of the APT layer 206N, there is a risk that a sacrificial semiconductor layer (such as SiGe) vertically between the bottommost channel layer 215 and the APT layer 206N might not be completely removed during the process of forming inner spacers 255. If this were to happen, there could be short circuit defects between the source/drain features 260P and the gate stacks 240. If the depth d4 is too large (such as more than 25 nm), there is a risk that the source/drain features 260P might extend completely through the APT layer 206N, lowering the effectiveness of the APT layer 206N and increasing leakage current. In various embodiments, the depth d4 is less than the depth d5 so that the anti-punch-through doping in the APT layer 206N fully surrounds the p-type source/drain feature 260P for effective suppression of leakage current.

As shown in FIGS. 1B, 1C, 1D-1, and other figures, the device 200 further includes a stack of semiconductor layers 215 suspended between each pair of the source/drain features 260N and another stack of semiconductor layers 215 suspended between each pair of the source/drain features 260P. The stack of semiconductor layers 215 serve as the transistor channels for the respective GAA devices. Accordingly, the semiconductor layers 215 are also referred to as channel layers 215. The channel layers 215 may include single crystalline silicon. Alternatively, the channel layers 215 may comprise germanium, silicon germanium, or another suitable semiconductor material(s). In the present embodiment, the channel layers 215 are undoped or are substantially free from the dopants that are in the APT layers 206N and 206P. For example, the dopant concentration in the channel layers 215 may be lower than about 1E16 atom/cm$^3$. In some embodiments, the channel layers 215 may be unintentionally doped with a very low concentration of dopants. For example, the dopant concentration in the channel layers 215 may be lower than about 5E16 atom/cm$^3$. Initially, the channel layers 215 are formed as part of a semiconductor layer stack that includes the channel layers 215 and some sacrificial semiconductor layers of a different material. During a gate replacement process, the semiconductor layer stack is selectively etched to remove the sacrificial semiconductor layers, leaving the channel layers 215 suspended over the substrate 202 and between the respective source/drain features 260N, 260P. This is also referred to as a channel release process, and will be discussed in more details with reference to FIG. 3 later. In various embodiments, the number of channel layers 215 in a GAA device may be in a range of 2 to 10, such as 3 or 4.

As shown in FIG. 1D-1 and other figures, the channel layers 215 for NMOS GAA are separated from each other by a spacing S1 along the z-direction, and the channel layers 215 for PMOS GAA are separated from each other by a spacing S2 along the z-direction. In the depicted embodiment, spacing S1 is about equal to S2 (for example, S1 and S2 are within 5% from each other), though the present disclosure contemplates embodiments where spacing S1 is different than spacing S2. Further, channel layers 215 for NMOS GAA have a width W1 along the "x" direction and a thickness "T1" along the "z" direction, and channel layers 215 for PMOS GAA have a width W2 along the "x" direction and a thickness "T2" along the "z" direction. In the depicted embodiment, thickness T1 is about equal to thickness T2 (for example, T1 and T2 are within 5% from each other), though the present disclosure contemplates embodiments where thickness T1 is different than thickness T2. In some embodiments, each of the thicknesses T1 and T2 may be in a range of about 4 nm to about 8 nm, and each of the spacing S1 and S2 may be in a range of about 6 nm to about 15 nm. Further, the sum of T1+S1 (and the sum of T2+S2) may be in a range of about 10 nm to 23 nm in some embodiments. In an embodiment, width W1 is about equal to width W2. In another embodiment, width W2 is different from width W1 depending on design objectives. For example, width W2 can be designed to be larger than width W1 to boost PMOSFET GAA's performance. The present disclosure contemplates embodiments where width W1 and width W2 have any configurations including W1 is equal to, smaller than, or greater than W2. Each of with widths W1 and W2 may be in a range of about 4 nm to about 70 nm in various embodiments. In some embodiments, the channel layers 215 may be cylindrical-shaped (e.g., nanowire), rectangular-shaped (e.g., nanobar), sheet-shaped (e.g., nanosheet), etc., or have other suitable shapes.

As shown in FIGS. 1B, 1C, 1D-2, 1D-3, and 1D-4, the gate stacks 240 include a gate dielectric layer 282, a work function metal layer 284 (it can be 284P for PMOS GAA and 284N for NMOS GAA), and a low resistance metal fill layer 350 in various embodiments. As shown in FIG. 1D-1, the low resistance metal fill layer 350 may be omitted in the gate stacks 240 in some embodiments. The gate stack 240 for a PMOS GAA is disposed between a pair of p-type source/drain features 260P, and the gate stack 240 for an NMOS GAA is disposed between a pair of n-type source/drain features 260N. As shown in FIG. 1A, some gate stacks 240 straddle a PMOS GAA and an NMOS GAA, and becomes a common gate for the PMOS GAA and the NMOS GAA). Although not shown in FIG. 1A, a gate stack 240 may engage a PMOS GAA only or an NMOS GAA only. Further, the width of the gate stacks 240 (also referred to as gate length, which is a dimension along the "y" direction in FIG. 1A), Lg, is in a range of 4 nm to 30 nm in various embodiments.

The gate dielectric layer 282 wraps around each of the semiconductor layers 215. The gate dielectric layer 282 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 282 may be formed by chemical oxidation, thermal oxidation, atomic layer deposition (ALD), chemical vapor deposition (CVD), and/or other suitable methods, and may have a thickness in a range of about 0.5 nm to about 3 nm. In some embodiments, the gate stacks 240 further include an interfacial layer between the gate dielectric layer 282 and the channel layers 215. The interfacial layer may include silicon dioxide, silicon oxynitride, or other suitable materials. In some embodiments, the work function metal layer 284N includes an n-type work function layer for NMOSFET GAA device, and the work function metal layer 284P includes a p-type work function layer for PMOSFET GAA device. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. The low resistance metal fill layer 350 may include tungsten, ruthenium, copper, and/or other suitable materials; and may be formed by CVD, PVD, plating, and/or other suitable processes. Since the gate stack 240 includes a high-k dielectric layer and metal layer(s), it is also referred to as a high-k metal gate. As shown in FIGS. 1B, 1C, 1D-2, 1D-3, and 1D-4, the low resistance metal fill layer 350 is not disposed in (or is free from) the area vertically between the bottommost channel layer 215 and the APT layer 206P, 206N.

FIGS. 1D-1, 1D-2, 1D-3, and 1D-4 show four alternative embodiments of the gate stacks 240. As shown in FIG. 1D-1, the gate stack 240 includes n-type work function metal layer 284N in the NMOS GAA and p-type work function metal layer 284P in the PMOS GAA. The gate stack 240 in this embodiment does not include the low resistance metal fill layer 350. As shown in FIG. 1D-2, the gate stack 240 includes n-type work function metal layer 284N in the NMOS GAA and p-type work function metal layer 284P in the PMOS GAA, and further includes the low resistance metal fill layer 350 disposed over both 284N and 284P. As shown in FIG. 1D-3, the gate stack 240 includes n-type work function metal layer 284N in the NMOS GAA, p-type work function metal layer 284P in the PMOS GAA, and the low resistance metal fill layer 350. The low resistance metal fill layer 350 is disposed not only over the top surface of the layers 284N and 284P, but also extend into the layers 284N and 284P. For example, the low resistance metal fill layer 350 may extend into the layers 284N and 284P to a level that is below the bottommost channel layer 215. In an embodiment, the work function metal layers 284N and 284P are deposited (for example using ALD) to have substantially uniform thickness along the various surfaces that they are deposited on. As such, trenches are formed between adjacent sidewalls of the work function metal layers 284N and 284P. Subsequently, the low resistance metal fill layer 350 is deposited into those trenches, forming the structure shown in FIG. 1D-3. As shown in FIG. 1D-4, the gate stack 240 includes a common work function metal layer 284 in the NMOS GAA and the PMOS GAA, and further includes the low resistance metal fill layer 350 disposed over the top surface of the layer 284. The present disclosure contemplates other configurations for the gate stacks 240.

As shown in FIGS. 1A, 1B, and 1C, the device 200 includes gate spacers 247 on sidewalls of the gate stack 240 and above the topmost channel layer 215, and further includes gate spacers 255 on sidewalls of the gate stack 240 and below the topmost channel layer 215. In the present disclosure, the gate spacers 247 are also referred to as outer spacers 247 or top spacers 247, and the gate spacers 255 are also referred to as inner spacers 255. The inner spacers 255 are disposed laterally between the source/drain features 260N (or 260P) and the gate stacks 240 and vertically between the channel layers 215. In various embodiments, the top spacers 247 may have a width along the "y" direction in a range of about 3 nm to about 12 nm, and the inner spacers 255 may have a width along the "y" direction in a range of about 3 nm to about 12 nm.

In the present embodiment, the device 200 further includes lightly doped source/drain (LDD) regions 262 that are between each channel layer 215 and the S/D features (or heavily doped S/D) 260A/B. The LDD regions 262 between channel layers 215b and S/D features 260N, 260P are surrounded by inner spacers 255, and the LDD regions 262 between the topmost channel layer 215 and S/D features 260N, 260P are surrounded by both inner spacer 255 and top spacer 247. The LDD regions 262 provide further device performance enhance (such as short channel control) to the GAA device 200.

As shown in FIGS. 1A, 1D-1, and other figures, the device 200 further includes gate-end dielectric features 404 that are disposed at ends of the gate stacks 240 and the top spacers 247. The top spacers 247, inner spacers 255, and gate-end dielectric features 404 provide isolation functions—isolating the gate stacks 240 from each other and from nearby conductors including source/drain features 260N and 260P and source/drain contacts 406 (FIG. 1B). In an embodiment, the materials for the top spacers 247, inner spacers 255, and gate-end dielectric features 404 are different from each other and the gate-end dielectric features 404 have the highest dielectric constant among the three. In an embodiment, the gate-end dielectric features 404 include a high-k material, such as selected from a group consisting of $Si_3N_4$, nitrogen-containing oxide, carbon-containing oxide, dielectric metal oxide such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof. In a further embodiment, the inner spacers 255 have a higher effective dielectric constant than the top spacers 247. For example, the inner spacers 255 may include a material selected from a group consisting of $SiO_2$, $Si_3N_4$, SiON, SiOC, SiOCN, nitride base dielectric material, air gap, or a combination thereof; and the top spacers 247 may include a material selected from a group consisting of $SiO_2$, $Si_3N_4$, carbon doped oxide, nitrogen doped oxide, porous oxide, air gap, or a combination thereof.

As shown in FIGS. 1D-1, 1D-2, 1D-3, and 1D-4, the device 200 further includes a gate-top dielectric layer 408 that is disposed over the gate stacks 240. In an embodiment, the thickness of the gate-top dielectric layer 408 is in a range of about 2 nm to about 60 nm. The gate-top dielectric layer 408 may include a material selected from the group consisting of silicon oxide, SiOC, SiON, SiOCN, nitride base dielectric, dielectric metal oxide such as Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof. The gate-top dielectric layer 408 may be formed by recessing the gate stacks 240 and the top spacers 247 to form trenches, fill the trenches with one or more dielectric materials, and performing a CMP process to remove excessive dielectric materials.

As shown in FIGS. 1B, 1C, 1E, 1F, and 1G, the device 200 further includes silicide features 261 over the source/drain features 260N and 260P, and source/drain contacts 406 over the silicide features 261. The silicide features 261 may be formed by depositing one or more metals over the S/D features 260N/P, performing an annealing process to the device 200 to cause reaction between the one or more metals and the S/D features 260N/P to produce the silicide features 261, and removing un-reacted portions of the one or more metals. The silicide features 261 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 406 may include a conductive barrier layer and a metal fill layer over the conductive barrier layer. The conductive barrier layer functions to prevent metal materials of the metal fill layer from diffusing into the dielectric layers adjacent the S/D contacts 406. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 406.

In an embodiment, the silicide features 261 and source/drain contacts 406 are formed by etching S/D contact holes using a self-aligned etching process and then performing the above disclosed deposition, annealing, and other processes in the contact holes to forming the silicide features 261 and source/drain contacts 406. The self-aligned etching process uses the gate-top dielectric layer 408, the top spacers 247, and/or the gate-end dielectric features 404 as an etch mask.

As shown in FIGS. 1B, 1C, and 1G, the device 200 further includes an inter-layer dielectric (ILD) layer 270. The ILD layer 270 is disposed over the isolation features 230, the source/drain contacts 406, and the gate-top dielectric layers 408. Various features including the S/D features 260N/P, the silicide features 261, the source/drain contacts 406, the gate stacks 240, the top spacers 247, the inner spacers 255, the gate-end dielectric features 404, and the gate-top dielectric layer 408 are embedded in the ILD layer 270. In some embodiments, the device 200 further includes a contact etch stop layer (CESL) between the ILD layer 270 and the S/D features 260N/P, the gate stacks 240, and the top spacers 247. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

As shown in FIGS. 1A and 1D-1 and other figures, the device 200 further includes gate vias 410 that are electrically connected to the gate stacks 240. As shown in FIGS. 1A, 1B, 1C, and 14, the device 200 further includes drain vias 411N and 411P that are electrically connected to the contacts 406 disposed on drain features 260N and 260P, respectively; and source vias 412N and 412P that are electrically connected to the contacts 406 disposed on source features 260N and 260P, respectively. Each of the gate vias 410, drain vias 411N/P, and source vias 412N/P may include a conductive barrier layer and a metal fill layer over the conductive barrier layer. The conductive barrier layer functions to prevent metal materials of the metal fill layer from diffusing into the dielectric layers adjacent the via. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the via.

Referring to FIG. 1G, in the well strap region, the device 200 also includes the substrate 202, the wells 204N/P, the APT layers 206N/P, the isolation features 230, the S/D features 260N/P (also referred to strap epitaxial features), the silicide features 261, the contacts 406 (also referred to as strap contacts), and the ILD layer 270 as discussed above. The p-type strap source/drain feature 260P is disposed over P well 204P and the p-type APT layer 206P; and the n-type strap source/drain feature 260N is disposed over N well 204P and the n-type APT layer 206N. The device 200 further includes strap vias 413P disposed over the strap contact 406 over the p-type strap source/drain feature 260P and strap vias 413N disposed over the strap contact 406 over the n-type strap source/drain feature 260N. The vias 413P and 413N may include the same material as the vias 411N/P and 412N/P discussed above.

In some embodiments, material and compositions for the contacts 406 and the various vias 411N/P, 412N/P, and 413N/P are designed to reduce resistance in these structures such that biasing to the wells 204N/P and source/drain features 260N/P can be more uniformly controlled (in addition to other benefits such as faster operation speed and lower power consumption). In an embodiment, the contacts 406 are formed by three layers—a bottom layer having Ti, an outer layer having TiN over the bottom layer, and a fill layer having Co over the bottom layer and surrounded by the outer layer. The bottom layer (Ti) provides a good interface with the silicide 261 having TiSi in an embodiment. The outer layer (TiN) acts as a diffusion barrier layer. The fill layer has a low resistance. To further this embodiment, each of the vias 411N/P, 412N/P, and 413N/P is formed with pure tungsten for low resistance. In another embodiment, each of the contacts 406 and the vias 411N/P, 412N/P, and 413N/P is formed with ruthenium for low resistance.

In some embodiments, source/drain contacts 406 can be formed to straddle multiple source/drain features 260N/P. Such contacts 406 are also referred to as long contacts. An example is shown in FIGS. 2A and 2B. Referring to FIGS. 2A and 2B, a contact 406 extends over and electrically connects a drain feature 260N of an NMOS GAA and a drain feature 260P of a PMOS GAA. The NMOS GAA and the PMOS GAA are thus coupled to form a CMOS GAA. A common drain via 411 is disposed over the long contact 406. Using long contacts 406 to form CMOS GAA reduces routing complexity. Other aspects of the device 200 in this embodiment are the same as those discussed with reference to FIGS. 1A through 1G.

FIG. 3 is a flow chart of a method 600 for fabricating a multi-gate device, such as the device 200, according to various aspects of the present disclosure. Method 600 is briefly described below in conjunction with FIGS. 4-12C. Additional processing is contemplated by the present disclosure. Additional steps can be provided before, during, and after method 600, and some of the steps described can be moved, replaced, or eliminated for additional embodiments of method 600.

At operation 602, the method 600 (FIG. 3) forms wells 204N, 204P over a substrate 202 and further forms anti-punch-through (APT) layers 206N and 206P. A resultant structure is shown in FIG. 4 in an embodiment. For example, the operation 602 may form a first hard mask to cover NMOS regions of the substrate 202 and to expose PMOS regions of the substrate 202, and then perform one or more ion implantation processes to the PMOS regions of the substrate 202 to form the N wells 204N. The operation 602 may heavily dope the upper section of the N wells 204N to form the APT layer 206N. The operation 602 may control the doping depth and the dopant concentration for the N wells 204N and the APT layer 206N as discussed earlier. Subsequently, the operation 602 removes the first hard mask and forms a second hard mask to cover PMOS regions of the substrate 202 and to expose NMOS regions of the substrate 202. Then, the operation 602 performs one or more ion implantation processes to the NMOS regions of the substrate 202 to form the P wells 204P. The operation 602 may heavily dope the upper section of the P wells 204P to form the APT layer 206P. The operation 602 may control the doping depth and the dopant concentration for the P wells 204P and the APT layer 206P as discussed earlier.

At operation 604, the method 600 (FIG. 3) forms a semiconductor layer stack 201 having semiconductor layers 210 and semiconductor layers 215 stacked vertically in an alternating or interleaving configuration from the top surface of the substrate 202. The resultant structure is shown in FIG. 5 in an embodiment. The topmost semiconductor layer 215 is labeled as 215a for convenience of discussion. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 210, a second one of semiconductor layers 210 is epitaxially grown on the first one of semiconductor layers 215, and so on until semiconductor layers stack 201 has a desired number of semiconductor layers 210 and semiconductor layers 215. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein. FIG. 5 also shows a hard mask layer 416 over the semiconductor layer stack 201 for protecting the semiconductor layer stack 201 during subsequent patterning process(es).

Figure 6:
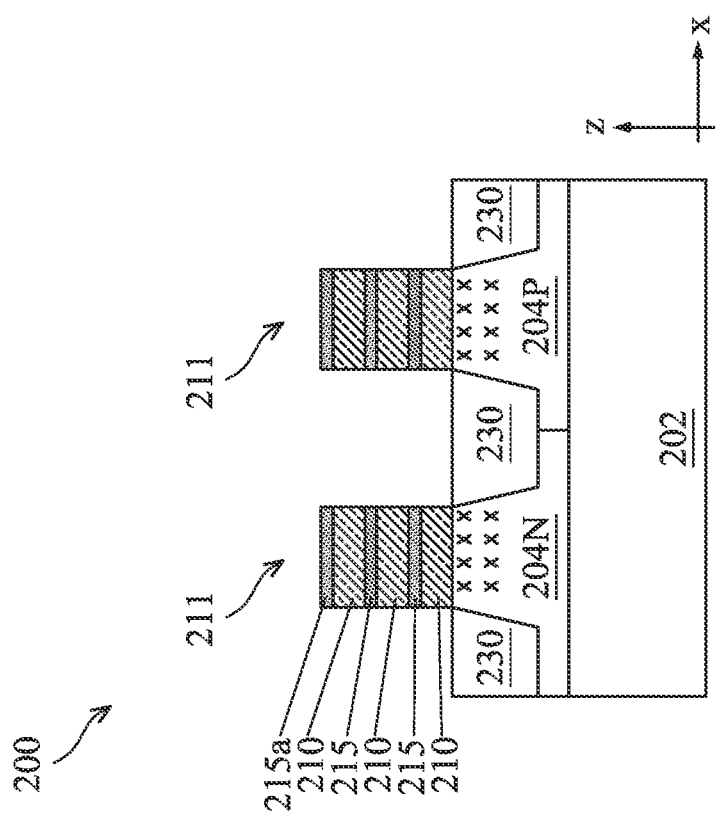

At operation 606, the method 600 (FIG. 3) patterns the semiconductor layer stack 201 into fins 211 and patterns the upper portion of the wells 204N/P into fins too, such as shown in FIG. 6. The fins 211 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the semiconductor layer stack 201 and is patterned using a photolithography process. Spacers are formed alongside the patterned sacrificial layer using a self-aligned process. The sacrificial layer is then removed, and the remaining spacers, or mandrels, may then be used as a masking element for patterning the fins. For example, the masking element may be used for etching recesses into the semiconductor layer stack 201 and the substrate 202, resulting in the fins 211. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins may be suitable.

The operation 606 further forms the isolation features 230. The isolation features 230 can be formed by filling the trenches between the fins with an insulator material, for example, by using a CVD process or a spin-on glass process. A chemical mechanical polishing (CMP) process may be performed to remove excessive insulator material and/or planarize a top surface of isolation features 230. Then an etching back process is performed to recess the isolation features 230 to a desired thickness, such as surrounding a lower portion of the fins and leaving an upper portion of the fins (particularly, the fins 211) protruding above the isolation features 230. In an embodiment, the hard mask layer 416 is removed during the CMP process or the etching back process.

At operation 608, the method 600 (FIG. 3) forms gate structures over the fins 211, wherein each gate structure includes a sacrificial gate stack 240' and top gate spacers 247. A resultant structure is shown in FIGS. 7A, 7B, and 7C, according to an embodiment. FIG. 7A is a top view of the device 200, in portion, and FIGS. 7B and 7C are cross-sectional views of the device 200, in portion, along the "Cross-section-H" line and the "Cross-section-V" line of the FIG. 7A, respectively. The sacrificial gate stack 240' includes a sacrificial gate dielectric layer 246 and a sacrificial gate electrode layer 245. The sacrificial gate dielectric layer 246 is formed on top and sidewalls of the fins 211 and the sacrificial gate electrode layer 245 is formed on the sacrificial gate dielectric layer 246. In embodiments, the sacrificial gate dielectric layer 246 may include a dielectric material, such as silicon oxide, silicon oxynitride, a high-k dielectric material, other suitable dielectric material, or combinations thereof; and the sacrificial gate electrode layer 245 includes a suitable dummy gate material, such as polysilicon layer. The sacrificial gate electrode layer 245 and the sacrificial gate dielectric layer 246 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof.

For example, the operation 606 may perform lithography patterning and etching process to pattern the sacrificial gate electrode layer 245 and the sacrificial gate dielectric layer 246. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof. Then, the operation 606 forms the top spacers 247 on the sidewalls of the sacrificial gate stacks 240' by deposition and etching processes.

At operation 610, the method 600 (FIG. 3) etches the fins 211 adjacent the top spacers 247 to form S/D trenches (or recesses) 250, such as shown in FIGS. 8A, 8B, and 8C. FIG. 8A is a top view of the device 200, in portion, and FIGS. 8B and 8C are cross-sectional views of the device 200, in portion, along the "Cross-section-H" line and the "Cross-section-V" line of the FIG. 8A, respectively. In the depicted embodiment, an etching process completely removes semiconductor layer stack 201 in source/drain regions of fins 211 and further extends into the wells 204N/P in the source/drain regions. For example, the source/drain trenches 250 for PMOS GAA devices extend a depth d4 below the top surface of the N well 204N as depicted in FIG. 8C. The depth d4 is controlled to be in a range of 5 nm to 25 nm in some embodiments, as discussed above. Although not shown in FIG. 8C, the source/drain trenches 250 for NMOS GAA devices extend a depth d1 below the top surface of the P well 204P (such as illustrated in FIG. 1B). The depth d1 is controlled to be in a range of 5 nm to 25 nm in some embodiments, as discussed above. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of the gate stacks 240', the top spacers 247, and the isolation features 230.

The operation 610 also forms gaps 418 between the semiconductor layers 215. For example, an etching process is performed that selectively etches semiconductor layers 210 exposed by source/drain trenches 250 with minimal (to no) etching of semiconductor layers 215, such that gaps 418 are formed between semiconductor layers 215 and between semiconductor layers 215 and the APT layer 206N/P under the top spacers 247. The etching process may be a dry etching process, a wet etching process, other suitable etching process, or combinations thereof. Because the source/drain trenches 250 extend below the top surface of the APT layers 206N/P, the semiconductor layer 210 between the bottommost semiconductor layer 215 and the APT layer 206N/P can be easily accessed by the etching processes to form the gaps 418. If the source/drain trenches 250 do not extend below the top surface of the APT layers 206N/P, this semiconductor layer 210 might not be completely removed in the gaps 418 and any remaining portion of this semiconductor layer 210 might lead to short circuits between the later formed source/drain features and gate stacks.

At operation 612, the method 600 (FIG. 3) forms the inner spacers 255 in the gaps 418, epitaxially grows the S/D features 260N/P, and forms the ILD layer 270, such as shown in FIGS. 9A, 9B, and 9C. FIG. 9A is a top view of the device 200, in portion, and FIGS. 9B and 9C are cross-sectional views of the device 200, in portion, along the "Cross-section-H" line and the "Cross-section-V" line of the FIG. 9A, respectively. For example, a deposition process forms a spacer layer over gate structures 240' and over features defining source/drain trenches 250. The deposition process may be CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 250. The deposition process is configured to ensure that the spacer layer fills the gaps 418. An etching process is then performed that selectively etches the spacer layer to form inner spacers 255 as depicted in FIG. 9C with minimal (to no) etching of semiconductor layers 215, dummy gate stacks 240', and gate spacers 247. In some embodiments, the spacer layer is removed from sidewalls of gate spacers 247, sidewalls of semiconductor layers 215, dummy gate stacks 240', and substrate 202. The spacer layer (and thus inner spacers 255) includes a material that is different than a material of semiconductor layers 215 and a material of gate spacers 247 to achieve desired etching selectivity during the second etching process. Then, the operation 612 forms the S/D features 260N and 260P using epitaxial growth processes. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202, the APT layers 206N/P, and the semiconductor layers 215. The operation 612 may dope the S/D features 260N and 260P in-situ or ex-situ as discussed earlier. After the S/D features 260N and 260P are epitaxially grown, the operation 612 forms a CESL over the S/D features 260N and 260P and the gate structures 240' and form the ILD layer 270 over the CESL.

At operation 614, the method 600 (FIG. 3) cuts the gate structures 240' and forms the gate-end dielectric features 404, such as shown in FIGS. 10A, 10B, and 10C. FIG. 10A is a top view of the device 200, in portion, and FIGS. 10B and 10C are cross-sectional views of the device 200, in portion, along the "Cross-section-H" line and the "Cross-section-V" line of the FIG. 10A, respectively. For example, the operation 614 may form an etch mask using deposition and photolithography processes. Then, the gate structure 240' and the gate spacers 247 are etched through openings in the etch mask using one or more etching process. The etching process can include a dry etching process, a wet etching process, other suitable etching process, or combinations thereof. The etching process is tuned selective to the materials in the gate structures 240' (the sacrificial gate electrode 245) and with no (or minimal) etching to the isolation structure 230 and the ILD 270. The etching process completely removes the sacrificial gate electrode 245 exposed in the openings of the etch mask, thereby cutting the sacrificial gate electrode 245 into segments. The etching process may completely or partially remove the gate spacers 247 exposed in the openings of the etch mask. The etching process results in trenches between the segments of the sacrificial gate electrode 245. Then, the operation 614 deposits one or more dielectric layers into the trenches and performs a CMP process to the one or more dielectric layers to form the gate-end dielectric features 404 as shown in FIGS. 10A and 10B.

At operation 616, the method 600 (FIG. 3) removes the gate structures 240' to form gate trenches 275 and removes the semiconductor layers 210 exposed in the gate trenches 275, such as shown in FIGS. 11A, 11B, and 11C. FIG. 11A is a top view of the device 200, in portion, and FIGS. 11B and 11C are cross-sectional views of the device 200, in portion, along the "Cross-section-H" line and the "Cross-section-V" line of the FIG. 11A, respectively. For example, operation 616 performs one or more etching processes to completely remove the sacrificial gate structures 240' (including the sacrificial gate electrode 245 and the sacrificial gate dielectric layer 246) to expose semiconductor layers 215 and semiconductor layers 210 in channel regions. The etching process(es) may include a dry etching process, a wet etching process, other suitable etching process, or combinations thereof. In some embodiments, the etching processes are configured to selectively etch the sacrificial gate structures 240' with minimal (to no) etching of other features of the device 200, such as ILD layer 270, gate spacers 247, isolation features 230, semiconductor layers 215, and semiconductor layers 210. Subsequently, operation 616 performs one or more etching processes to selectively etch semiconductor layers 210 with minimal (to no) etching of semiconductor layers 215 and, in some embodiments, minimal (to no) etching of gate spacers 247 and/or inner spacers 255. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. The etching process may include a dry etching process, a wet etching process, other suitable etching process, or combinations thereof. As a result, the semiconductor layers 215 are suspended in the gate trenches 275. This process is also referred to as a channel release process.

At operation 618, the method 600 (FIG. 3) forms the high-k metal gate stacks 240 in the gate trenches 275, such as shown in FIGS. 12A, 12B, and 12C. FIG. 12A is a top view of the device 200, in portion, and FIGS. 12B and 12C are cross-sectional views of the device 200, in portion, along the "Cross-section-H" line and the "Cross-section-V" line of the FIG. 12A, respectively. For example, the operation 618 may form the gate dielectric layer 282 using chemical oxidation, thermal oxidation, atomic layer deposition (ALD), chemical vapor deposition (CVD), and/or other suitable methods, and may form the work function metal layers 284N/P and the low resistance metal fill layer 350 (not shown in FIGS. 12B-C, but shown in FIGS. 1D-2, 1D-3, and 1D-4) using ALD, CVD, PVD, plating, and/or other suitable processes.

At operation 620, the method 600 (FIG. 3) performs further fabrication processes to the device 200, such as forming the gate top dielectric 408, forming S/D contacts 406, forming the various vias 410, 411N/P, 412N/P, 413N/P, and so on. In an embodiment, the above operations are performed to the device regions and the well strap regions at the same time to form the NMOS GAA, PMOS GAA, and the well strap structures such as shown in FIG. 2B.

Although not intended to be limiting, one or more embodiments of the present disclosure provide many benefits to a semiconductor device and the formation thereof. For example, embodiments of the present disclosure provide structures (e.g., anti-punch-through layers) and operation methods (e.g., gate, source, drain, and well biasing scheme) to reduce leakage current in GAA devices. For example, by combining the disclosed biasing scheme and a relatively lightly doped APT layer, the leakage current between source and drain terminals of a GAA device in standby mode can be greatly reduced while the channel layers of the GAA device are substantially free from the dopants of the APT layer. The disclosed structure and methods can be readily integrated into existing semiconductor manufacturing processes.

In one example aspect, the present disclosure is directed to a semiconductor device that includes a substrate; a well of a first conductivity-type over the substrate, the well including an anti-punch-through (APT) layer at an upper section of the well and being of the first conductivity-type; a source feature and a drain feature over the APT layer and being of a second conductivity-type opposite to the first conductivity-type; a strap epitaxial feature disposed over the well and being of the first conductivity-type; multiple channel layers suspended over the APT layer and connecting the source feature to the drain feature, wherein the multiple channel layers are vertically stacked one over another; a high-k metal gate wrapping around each of the channel layers, wherein a first portion of the high-k metal gate is disposed between a bottommost one of the channel layers and the APT layer; a source contact disposed over and electrically coupled to the source feature; a source via landed on the source contact; a drain contact disposed over and electrically coupled to the drain feature; a drain via landed on the drain contact; a strap contact disposed over and electrically coupled to the strap epitaxial feature; and a strap via landed on the strap contact, wherein the source via and the strap via are configured to be coupled to different voltages during a non-active mode of the semiconductor device and to be coupled to a substantially same voltage during an active mode of the semiconductor device.

In an embodiment of the semiconductor device, the first conductivity-type is p-type and the second conductivity-type is n-type. During the non-active mode, the drain via is configured to be coupled to a positive supply voltage, the source via is configured to be coupled to ground, and the strap via is configured to be coupled to a third voltage that is lower than ground. In a further embodiment, the third voltage is lower than ground by about 0.1V to about 0.6V.

In an embodiment of the semiconductor device, the first conductivity-type is p-type and the second conductivity-type is n-type. During the non-active mode, the high-k metal gate is configured to be coupled to a positive supply voltage, the source via and the drain via are configured to be coupled to ground, and the strap via is configured to be coupled to a third voltage that is lower than ground.

In an embodiment of the semiconductor device, the first conductivity-type is n-type and the second conductivity-type is p-type. During the non-active mode, the drain via is configured to be coupled to ground, the source via is configured to be coupled to a positive supply voltage, and the strap via is configured to be coupled to a third voltage that is higher than the positive supply voltage. In a further embodiment, the third voltage is higher than the positive supply voltage by about 0.1V to about 0.6V.

In an embodiment of the semiconductor device, the first conductivity-type is n-type and the second conductivity-type is p-type. During the non-active mode, the high-k metal gate is configured to be coupled to ground, the source via and the drain via are configured to be coupled to a positive supply voltage, and the strap via is configured to be coupled to a third voltage that is higher than the positive supply voltage.

In an embodiment of the semiconductor device, a first dopant concentration in the APT layer is higher than a second dopant concentration in the well, and a ratio of the first dopant concentration to the second dopant concentration is in a range of about 2 to about 100. In another embodiment of the semiconductor device, a bottom surface of the source feature is below an interface between the high-k metal gate and the APT layer by about 5 nm to about 25 nm.

In another example aspect, the present disclosure is directed to a semiconductor device that includes a substrate and a well of a first conductivity-type over the substrate. The well includes an anti-punch-through (APT) layer at an upper section of the well and being of the first conductivity-type. The APT layer includes a first dopant. The semiconductor device further includes a source feature and a drain feature over the APT layer and being of a second conductivity-type opposite to the first conductivity-type and multiple channel layers suspended over the APT layer and connecting the source feature to the drain feature. The multiple channel layers are vertically stacked one over another and are substantially free from the first dopant. The semiconductor device further includes a high-k metal gate wrapping around each of the channel layers. A first portion of the high-k metal gate is disposed between a bottommost one of the channel layers and the APT layer. A bottom surface of the source feature is about 5 nm to about 25 nm below an interface between the first portion of the high-k metal gate and the APT layer. The semiconductor device further includes inner dielectric spacers disposed between the high-k metal gate and the source feature and the drain feature respectively and top dielectric spacers disposed over sidewalls of the high-k metal gate and over a topmost one of the channel layers.

In an embodiment of the semiconductor device, the APT layer includes a first semiconductor material doped with the first dopant at a first dopant concentration, the well includes the first semiconductor material doped with the first dopant at a second dopant concentration, and a ratio of the first dopant concentration to the second dopant concentration is in a range of about 2 to about 100.

In an embodiment of the semiconductor device, the high-k metal gate includes a high-k dielectric layer, a work function metal layer over the high-k dielectric layer, and a metal fill layer over the work function metal layer, wherein the metal fill layer is free from the first portion of the high-k metal gate.

In an embodiment, the semiconductor device further includes a strap epitaxial feature disposed over the well and being of the first conductivity-type; a source contact disposed over and electrically coupled to the source feature; a source via landed on the source contact; a drain contact disposed over and electrically coupled to the drain feature; a drain via landed on the drain contact; a strap contact disposed over and electrically coupled to the strap epitaxial feature; and a strap via landed on the strap contact, wherein the source via and the strap via are configured to be coupled to different voltages during a non-active mode of the semiconductor device and to be coupled to a substantially same voltage during an active mode of the semiconductor device. In a further embodiment, each of the source contact, the drain contact, and the strap contact includes a titanium layer, a titanium nitride layer over the titanium layer, and a cobalt layer over the titanium nitride layer. In a further embodiment, each of the source via, the drain via, and the strap via includes tungsten. In a further embodiment, each of the source contact, the drain contact, the strap contact, the source via, the drain via, and the strap via includes ruthenium.

In yet another example aspect, the present disclosure is directed to a semiconductor device that includes a substrate; a p-type well over the substrate and having a p-type anti-punch-through (APT) layer; an n-type well over the substrate and having an n-type anti-punch-through (APT) layer; an n-type source feature and an n-type drain feature over the p-type APT layer; a p-type source feature and a p-type drain feature over the n-type APT layer; multiple first channel layers suspended over the p-type APT layer and connecting the n-type source feature to the n-type drain feature; multiple second channel layers suspended over the n-type APT layer and connecting the p-type source feature to the p-type drain feature; and a high-k metal gate wrapping around each of the first and the second channel layers. The multiple first channel layers are vertically stacked one over another and are undoped. The multiple second channel layers are vertically stacked one over another and are undoped. A bottom surface of the n-type source feature is about 5 nm to about 25 nm below an interface between the high-k metal gate and the p-type APT layer, and a bottom surface of the p-type source feature is about 5 nm to about 25 nm below an interface between the high-k metal gate and the n-type APT layer. The semiconductor device further includes a first source contact disposed over and electrically coupled to the n-type source feature; a second source contact disposed over and electrically coupled to the p-type source feature; and a drain contact disposed over and electrically coupled to both the n-type drain feature and the p-type drain feature.

In an embodiment, the semiconductor device further includes a p-type strap epitaxial feature disposed over the p-type well; a first source via landed on the first source contact; a first strap contact disposed over and electrically coupled to the p-type strap epitaxial feature; and a first strap via landed on the first strap contact. During a non-active mode of the semiconductor device, the first source via is configured to be coupled to ground and the first strap via is configured to be coupled to a first voltage that is lower than ground. In a further embodiment, the semiconductor device further an n-type strap epitaxial feature disposed over the n-type well; a second source via landed on the second source contact; a second strap contact disposed over and electrically coupled to the n-type strap epitaxial feature; and a second strap via landed on the second strap contact. During the non-active mode of the semiconductor device, the second source via is configured to be coupled to a positive supply voltage, and the second strap via is configured to be coupled to a second voltage that is higher than the positive supply voltage. In a further embodiment, the first voltage that is lower than ground by about 0.1V to about 0.6V, and the second voltage is higher than the positive supply voltage by about 0.1V to about 0.6V.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate;
a well of a first conductivity-type over the substrate, the well including an anti-punch-through (APT) layer at an upper section of the well and being of the first conductivity-type;
a source feature and a drain feature over the APT layer and being of a second conductivity-type opposite to the first conductivity-type;
a strap epitaxial feature disposed over the well and being of the first conductivity-type;
multiple channel layers suspended over the APT layer and connecting the source feature to the drain feature, wherein the multiple channel layers are vertically stacked one over another;
a high-k metal gate wrapping around each of the channel layers, wherein a first portion of the high-k metal gate is disposed between a bottommost one of the channel layers and the APT layer;
a source contact disposed over and electrically coupled to the source feature;
a source via landed on the source contact;
a drain contact disposed over and electrically coupled to the drain feature;
a drain via landed on the drain contact;
a strap contact disposed over and electrically coupled to the strap epitaxial feature; and
a strap via landed on the strap contact, wherein the source via and the strap via are configured to be coupled to different voltages during a non-active mode of the semiconductor device and to be coupled to a substantially same voltage during an active mode of the semiconductor device.

2. The semiconductor device of claim 1, wherein the first conductivity-type is p-type and the second conductivity-type is n-type, and wherein, during the non-active mode, the drain via is configured to be coupled to a positive supply voltage, the source via is configured to be coupled to ground, and the strap via is configured to be coupled to a third voltage that is lower than ground.

3. The semiconductor device of claim 2, wherein the third voltage is lower than ground by about 0.1V to about 0.6V.

4. The semiconductor device of claim 1, wherein the first conductivity-type is p-type and the second conductivity-type is n-type, and wherein, during the non-active mode, the high-k metal gate is configured to be coupled to a positive supply voltage, the source via and the drain via are configured to be coupled to ground, and the strap via is configured to be coupled to a third voltage that is lower than ground.

5. The semiconductor device of claim 1, wherein the first conductivity-type is n-type and the second conductivity-type is p-type, and wherein, during the non-active mode, the drain via is configured to be coupled to ground, the source via is configured to be coupled to a positive supply voltage, and the strap via is configured to be coupled to a third voltage that is higher than the positive supply voltage.

6. The semiconductor device of claim 5, wherein the third voltage is higher than the positive supply voltage by about 0.1V to about 0.6V.

7. The semiconductor device of claim 1, wherein the first conductivity-type is n-type and the second conductivity-type is p-type, and wherein, during the non-active mode, the high-k metal gate is configured to be coupled to ground, the source via and the drain via are configured to be coupled to a positive supply voltage, and the strap via is configured to be coupled to a third voltage that is higher than the positive supply voltage.

8. The semiconductor device of claim 1, wherein a first dopant concentration in the APT layer is higher than a second dopant concentration in the well, and a ratio of the first dopant concentration to the second dopant concentration is in a range of about 2 to about 100.

9. The semiconductor device of claim 1, wherein a bottom surface of the source feature is below an interface between the high-k metal gate and the APT layer by about 5 nm to about 25 nm.

10. A semiconductor device, comprising:
a substrate;
a well of a first conductivity-type over the substrate, the well including an anti-punch-through (APT) layer at an upper section of the well and being of the first conductivity-type, wherein the APT layer includes a first dopant;
a source feature and a drain feature over the APT layer and being of a second conductivity-type opposite to the first conductivity-type;
multiple channel layers suspended over the APT layer and connecting the source feature to the drain feature, wherein the multiple channel layers are vertically stacked one over another, wherein the multiple channel layers are substantially free from the first dopant;
a high-k metal gate wrapping around each of the channel layers, wherein a first portion of the high-k metal gate is disposed between a bottommost one of the channel layers and the APT layer, wherein a bottom surface of the source feature is about 5 nm to about 25 nm below an interface between the first portion of the high-k metal gate and the APT layer;
a strap epitaxial feature disposed over the well and being of the first conductivity-type;
a strap contact disposed over and electrically coupled to the strap epitaxial feature; and
a strap via landed on the strap contact.

11. The semiconductor device of claim 10, wherein the APT layer includes a first semiconductor material doped with the first dopant at a first dopant concentration, the well includes the first semiconductor material doped with the first dopant at a second dopant concentration, and a ratio of the first dopant concentration to the second dopant concentration is in a range of about 2 to about 100.

12. The semiconductor device of claim 10, wherein the high-k metal gate includes a high-k dielectric layer, a work function metal layer over the high-k dielectric layer, and a metal fill layer over the work function metal layer, wherein the metal fill layer is free from the first portion of the high-k metal gate.

13. The semiconductor device of claim 10, further comprising:
a source contact disposed over and electrically coupled to the source feature;
a source via landed on the source contact;
a drain contact disposed over and electrically coupled to the drain feature; and
a drain via landed on the drain contact,
wherein the source via and the strap via are configured to be coupled to different voltages during a non-active mode of the semiconductor device and to be coupled to a substantially same voltage during an active mode of the semiconductor device.

14. The semiconductor device of claim 13, wherein each of the source contact, the drain contact, and the strap contact includes a titanium layer, a titanium nitride layer over the titanium layer, and a cobalt layer over the titanium nitride layer.

15. The semiconductor device of claim 14, wherein each of the source via, the drain via, and the strap via includes tungsten.

16. The semiconductor device of claim 13, wherein each of the source contact, the drain contact, the strap contact, the source via, the drain via, and the strap via includes ruthenium.

17. The semiconductor device of claim 10, further comprising:
inner dielectric spacers disposed between the high-k metal gate and the source feature and the drain feature respectively; and
top dielectric spacers disposed over sidewalls of the high-k metal gate and over a topmost one of the channel layers.

18. A semiconductor device, comprising:
a substrate;
a p-type well over the substrate and having a p-type anti-punch-through (APT) layer;
an n-type well over the substrate and having an n-type anti-punch-through (APT) layer;
an n-type source feature and an n-type drain feature over the p-type APT layer;
a p-type source feature and a p-type drain feature over the n-type APT layer;
multiple first channel layers suspended over the p-type APT layer and connecting the n-type source feature to the n-type drain feature, wherein the multiple first channel layers are vertically stacked one over another and are undoped;
multiple second channel layers suspended over the n-type APT layer and connecting the p-type source feature to the p-type drain feature, wherein the multiple second channel layers are vertically stacked one over another and are undoped;
a high-k metal gate wrapping around each of the first and the second channel layers, wherein a bottom surface of the n-type source feature is about 5 nm to about 25 nm below an interface between the high-k metal gate and the p-type APT layer, and a bottom surface of the p-type source feature is about 5 nm to about 25 nm below an interface between the high-k metal gate and the n-type APT layer;

a first source contact disposed over and electrically coupled to the n-type source feature;

a second source contact disposed over and electrically coupled to the p-type source feature;

a drain contact disposed over and electrically coupled to both the n-type drain feature and the p-type drain feature;

a p-type strap epitaxial feature disposed over the p-type well;

a first source via landed on the first source contact;

a first strap contact disposed over and electrically coupled to the p-type strap epitaxial feature; and a first strap via landed on the first strap contact, wherein, during a non-active mode of the semiconductor device, the first source via is configured to be coupled to ground and the first strap via is configured to be coupled to a first voltage that is lower than ground.

19. The semiconductor device of claim 18, further comprising:

an n-type strap epitaxial feature disposed over the n-type well;

a second source via landed on the second source contact;

a second strap contact disposed over and electrically coupled to the n-type strap epitaxial feature; and a second strap via landed on the second strap contact, wherein, during the non-active mode of the semiconductor device, the second source via is configured to be coupled to a positive supply voltage, and the second strap via is configured to be coupled to a second voltage that is higher than the positive supply voltage.

20. The semiconductor device of claim 19, wherein the first voltage that is lower than ground by about 0.1V to about 0.6V, and the second voltage is higher than the positive supply voltage by about 0.1V to about 0.6V.

* * * * *